United States Patent
Kasper

(10) Patent No.: US 8,887,384 B2
(45) Date of Patent: Nov. 18, 2014

(54) METHOD FOR PRODUCING A CIRCUIT BOARD HAVING LEDS AND PRINTED REFLECTOR SURFACES, AND CIRCUIT BOARD PRODUCED ACCORDING TO THE METHOD

(75) Inventor: Alexander Kasper, Graz (AT)

(73) Assignee: Austria Technologie & Systemtechnik AG, Leoben (AT)

( * ) Notice: Subject to any disclaimer, the term of this patent is extended or adjusted under 35 U.S.C. 154(b) by 273 days.

(21) Appl. No.: 13/266,144

(22) PCT Filed: Apr. 24, 2010

(86) PCT No.: PCT/EP2010/002537
§ 371 (c)(1),
(2), (4) Date: Dec. 16, 2011

(87) PCT Pub. No.: WO2010/124825
PCT Pub. Date: Nov. 4, 2010

(65) Prior Publication Data
US 2012/0092867 A1    Apr. 19, 2012

(30) Foreign Application Priority Data
Apr. 29, 2009  (DE) .......................... 10 2009 019 412

(51) Int. Cl.
*H05K 3/02* (2006.01)
*H05K 3/10* (2006.01)
*H05K 1/02* (2006.01)
*H01L 33/60* (2010.01)

(52) U.S. Cl.
CPC ........ *H05K 1/02* (2013.01); *H05K 2201/10106* (2013.01); *H05K 2201/09781* (2013.01); *H05K 2201/2054* (2013.01); *H05K 2201/091* (2013.01); *H05K 2201/09909* (2013.01); *H05K 2203/013* (2013.01); *H05K 2203/1476* (2013.01); *H01L 33/60* (2013.01)
USPC .................. 29/846; 29/825; 29/829; 257/98; 257/433

(58) Field of Classification Search
CPC .................... H01L 33/60; H01L 33/46; H01L 2924/12041; H01L 33/58; F21Y 2101/02; F21Y 2113/005; F21Y 2111/008; F21K 9/90; F21V 19/001; F21V 19/042; G02F 1/133603; Y10S 362/80; H05K 2201/10106
USPC .............. 29/846, 825, 829, 855; 257/98, 433, 257/434, 680, E23.128; 438/27, 40
See application file for complete search history.

(56) References Cited

U.S. PATENT DOCUMENTS 7,679,100 B2    3/2010   Schwenkschuster et al.
7,718,456 B2 *  5/2010   Maeda et al. .................. 438/40
(Continued)

FOREIGN PATENT DOCUMENTS

EP    1 670 295    6/2006
EP    1 770 793    4/2007
(Continued)

OTHER PUBLICATIONS

International Search Report dated Aug. 26, 2010 in PCT/EP2010/002537.

(Continued)

*Primary Examiner* — Thiem Phan
(74) *Attorney, Agent, or Firm* — Faegre Baker Daniels LLP

(57) ABSTRACT

The invention relates to a circuit board having a light source for illumination purposes, having at least one LED electrically conductively connected to conductors of the circuit board, and the light thereof being converted into directed light by means of at least one mirror disposed on the circuit board, characterized in that the mirror is designed as a reflective coating printed onto the circuit board.

21 Claims, 29 Drawing Sheets

(56) References Cited

U.S. PATENT DOCUMENTS

Figure 1:
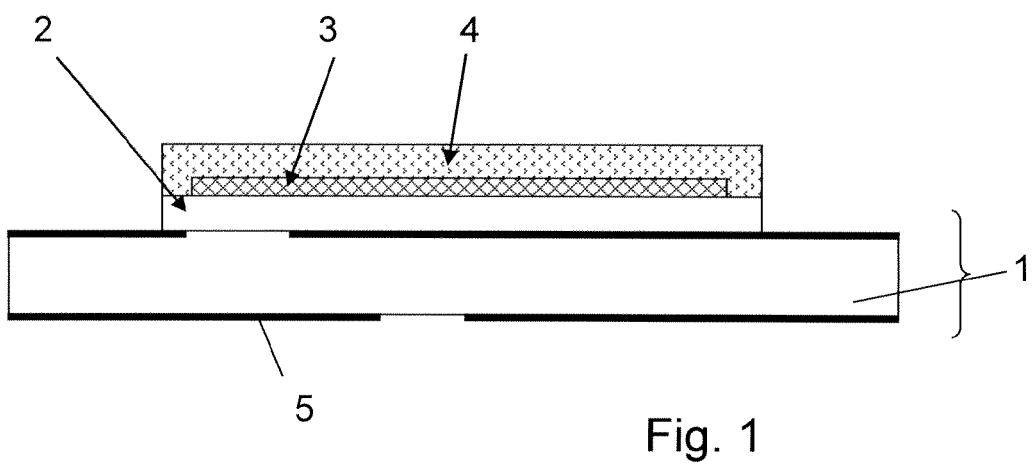

| | | |
|---|---|---|
| 7,880,254 B2 * | 2/2011 | Furuyama .................... 257/434 |
| 2004/0145858 A1 | 7/2004 | Sakurada |
| 2006/0012991 A1 | 1/2006 | Weaver, Jr. et al. |
| 2006/0147746 A1 | 7/2006 | Wakako et al. |
| 2006/0292769 A1 | 12/2006 | Wada et al. |
| 2007/0158674 A1 | 7/2007 | Taguchi et al. |
| 2007/0177380 A1 | 8/2007 | Schultz et al. |
| 2007/0187706 A1 | 8/2007 | Higashi et al. |

FOREIGN PATENT DOCUMENTS

| | | |
|---|---|---|
| EP | 1 806 792 | 7/2007 |
| EP | 1 821 345 | 8/2007 |
| JP | 2008-507135 | 3/2008 |
| JP | 2009-65219 | 3/2009 |
| WO | 2005/088736 | 9/2005 |
| WO | 2006/019730 A2 | 2/2006 |
| WO | 2007/033031 | 3/2007 |

OTHER PUBLICATIONS

International Preliminary Report of Patentability dated Jul. 27, 2011 in PCT/EP2010/002537.
Written Opinion dated Aug. 26, 2010 in PCT/EP2010/002537.
Search Report dated Jun. 12, 2009 in corresponding German Application No. 10 2009 019 412.6.

* cited by examiner

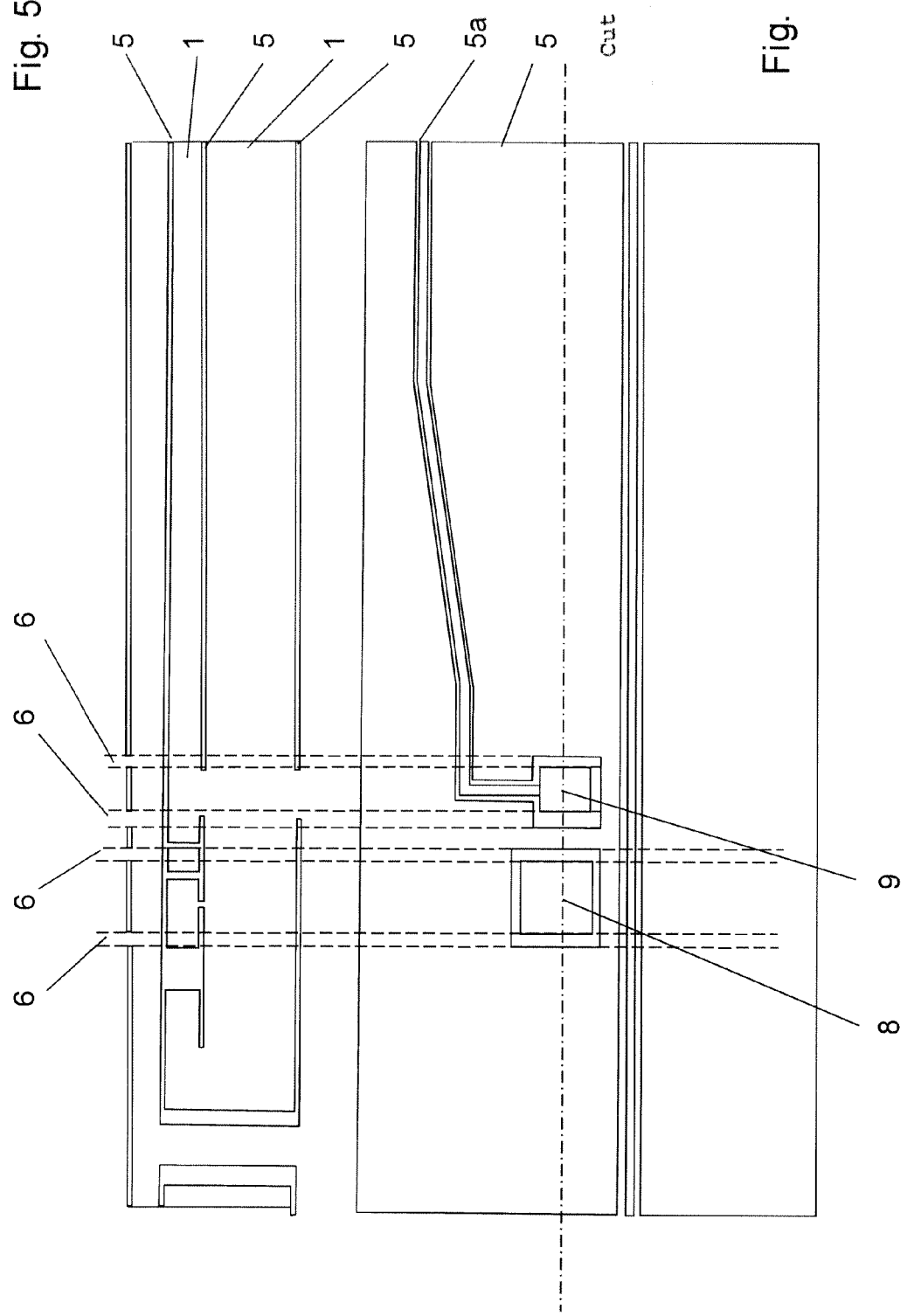

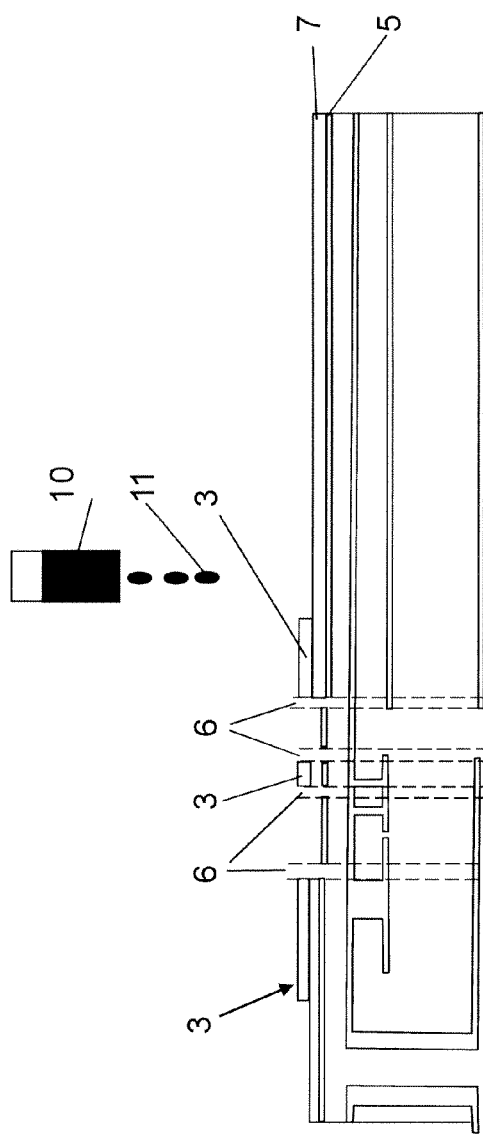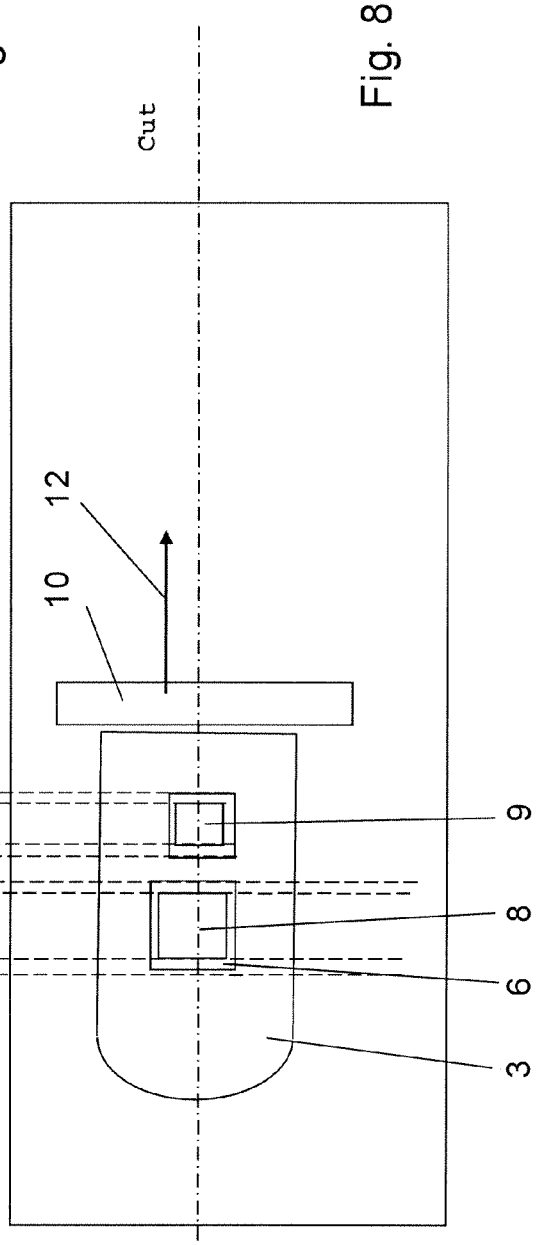

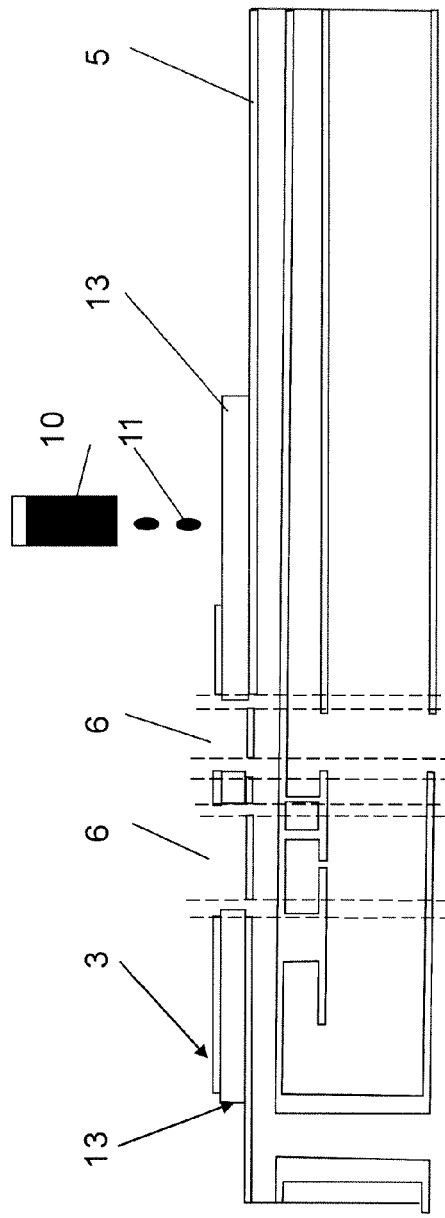
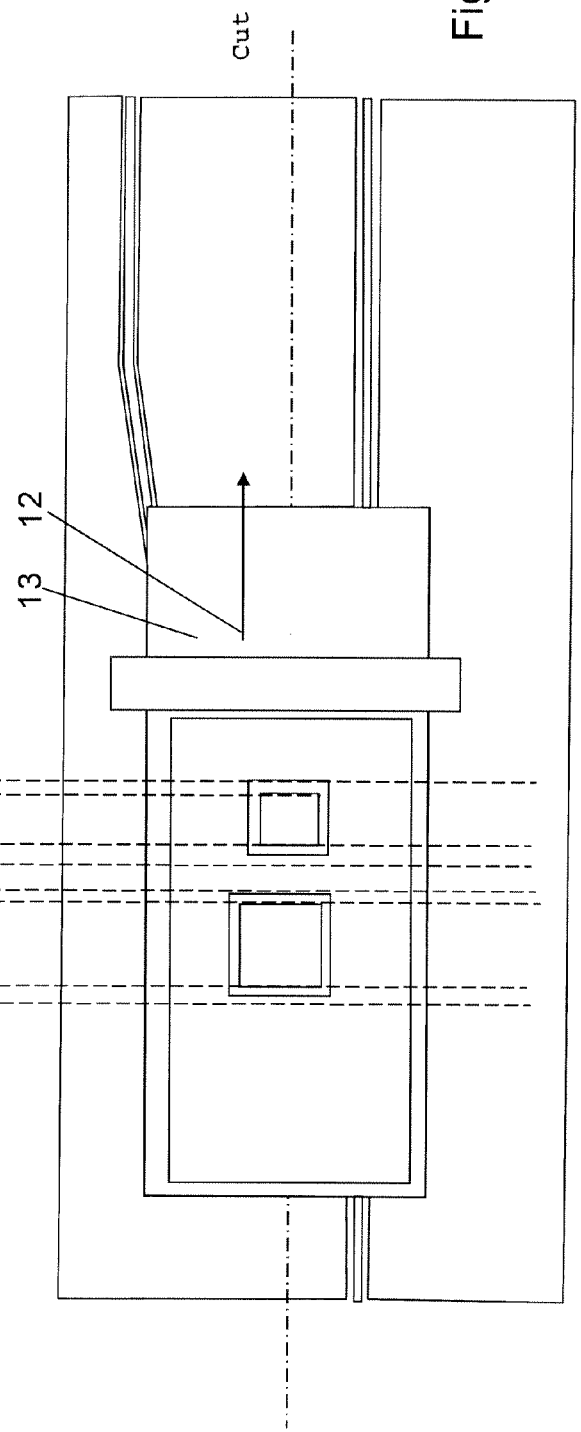
Fig. 9
Fig. 10

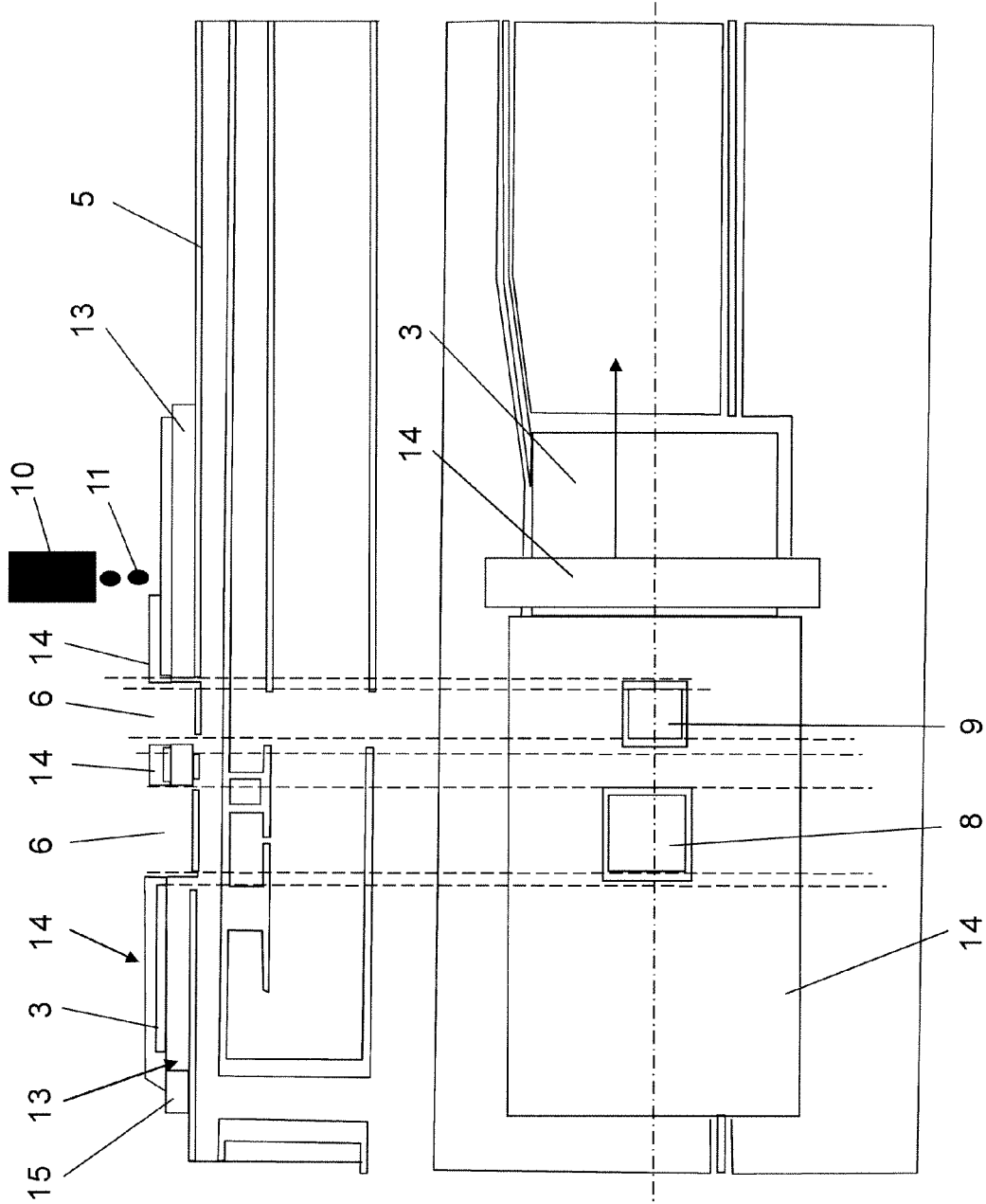

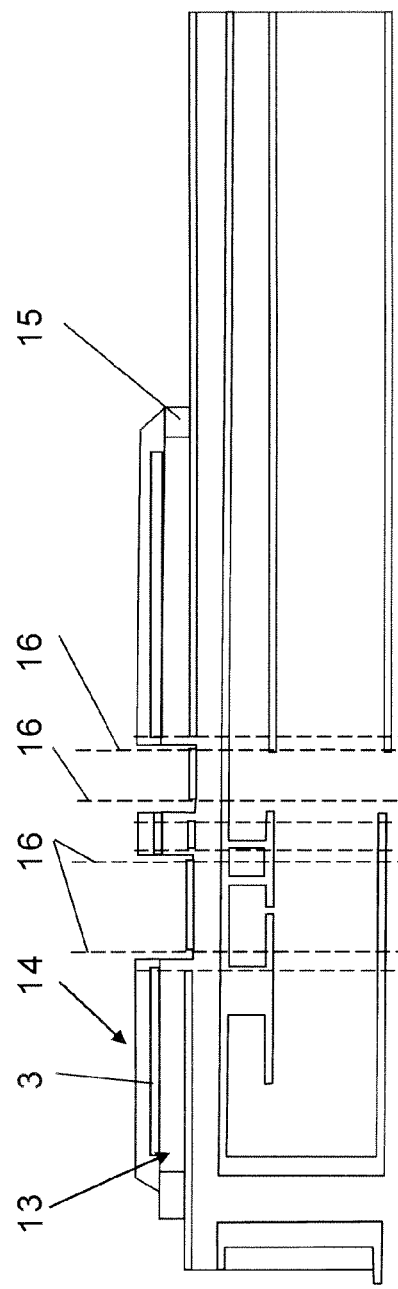
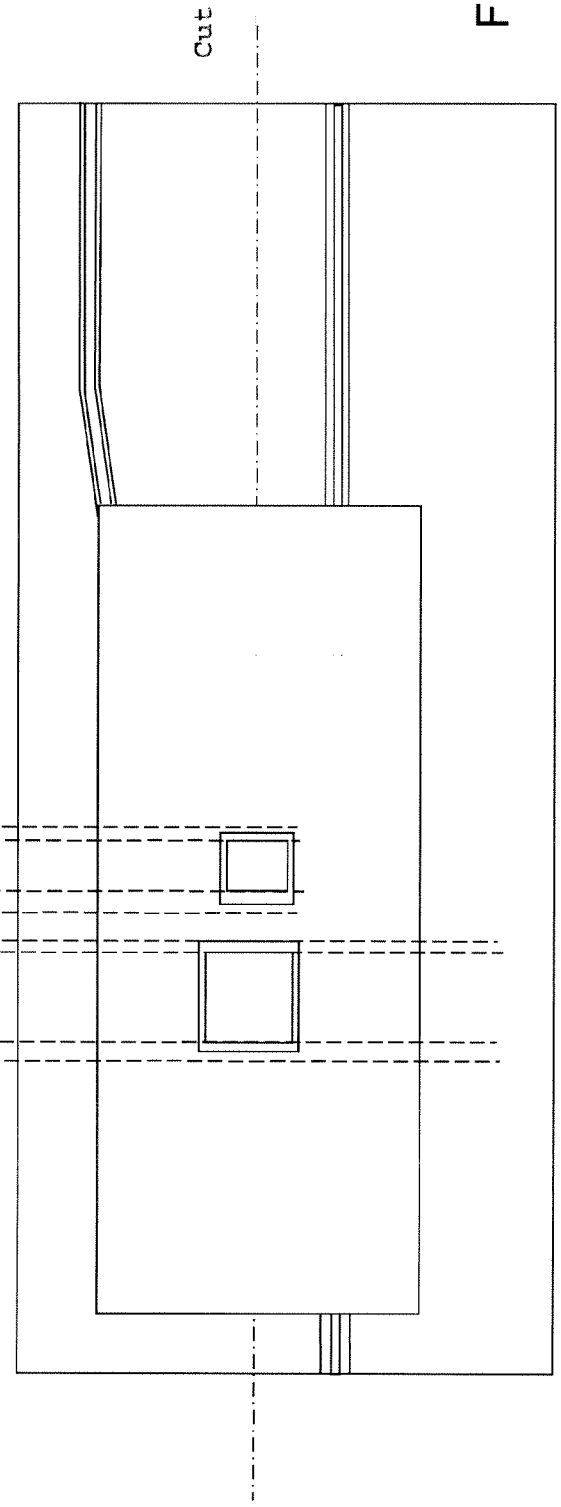

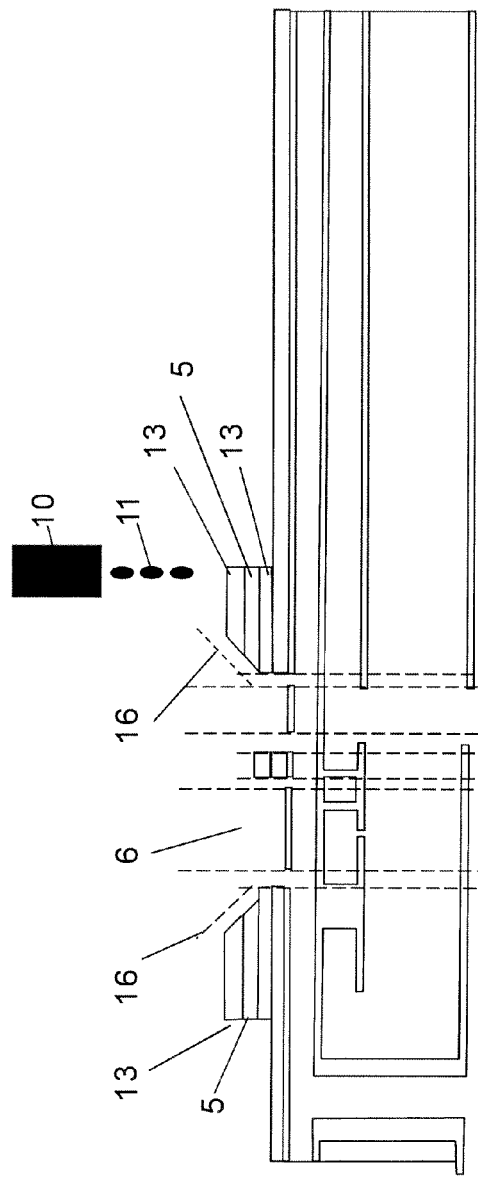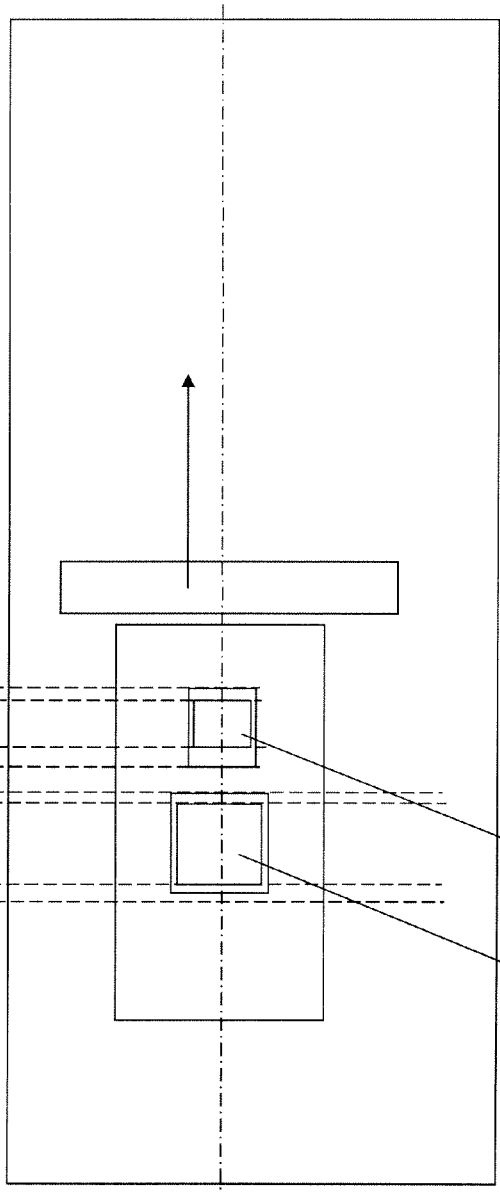

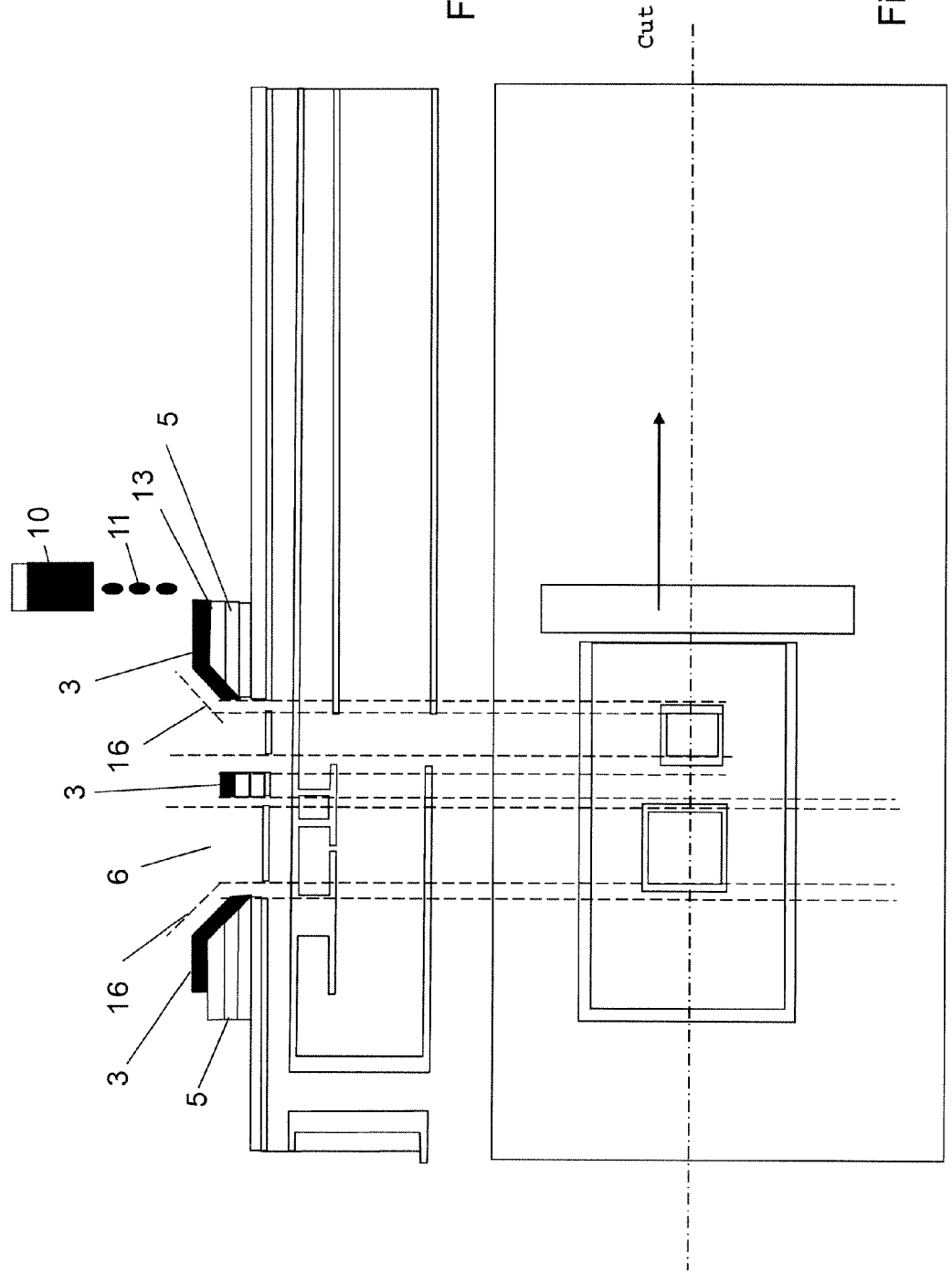

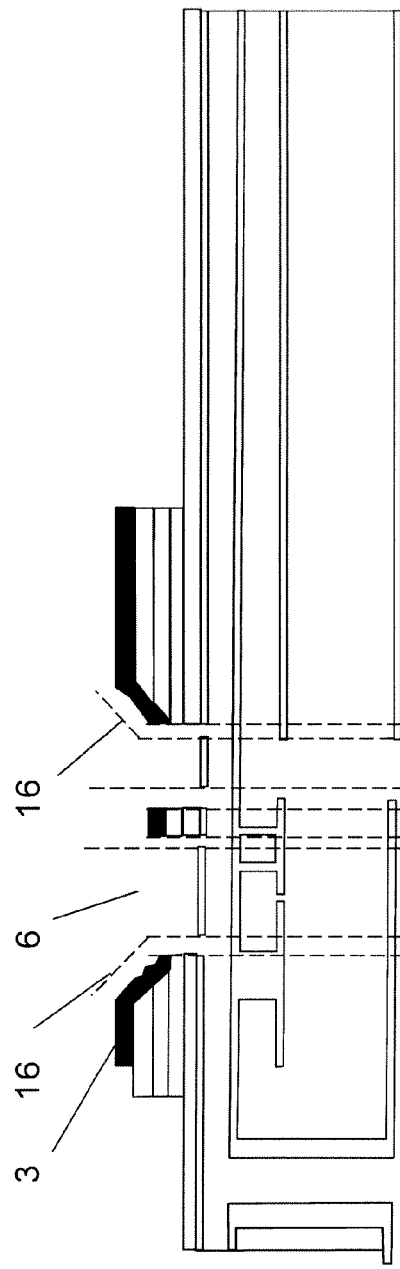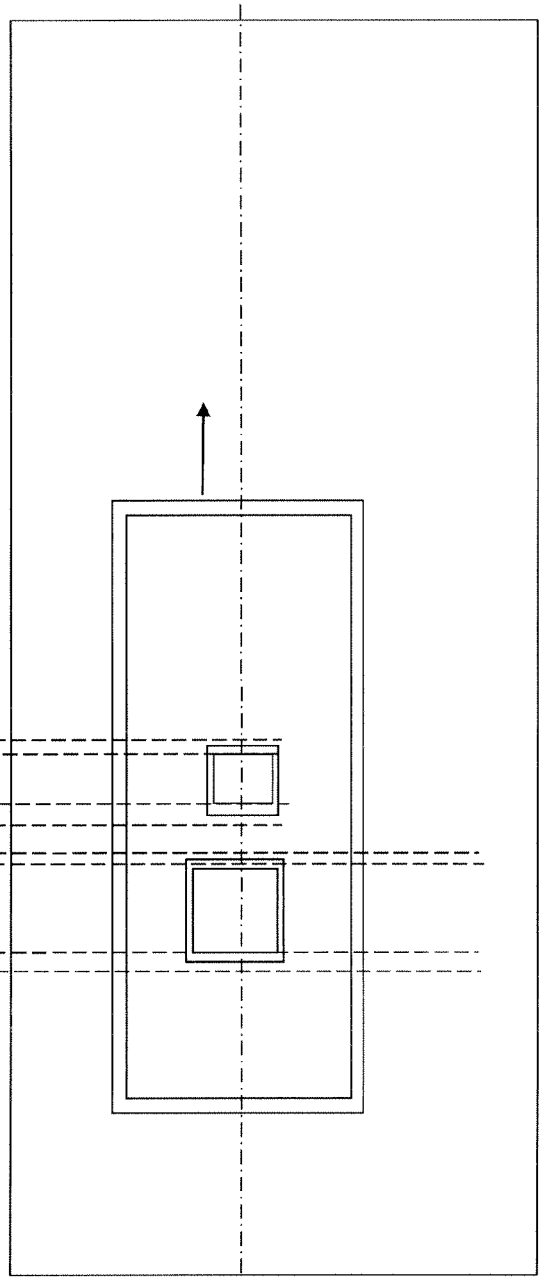
Fig. 19
Fig. 20

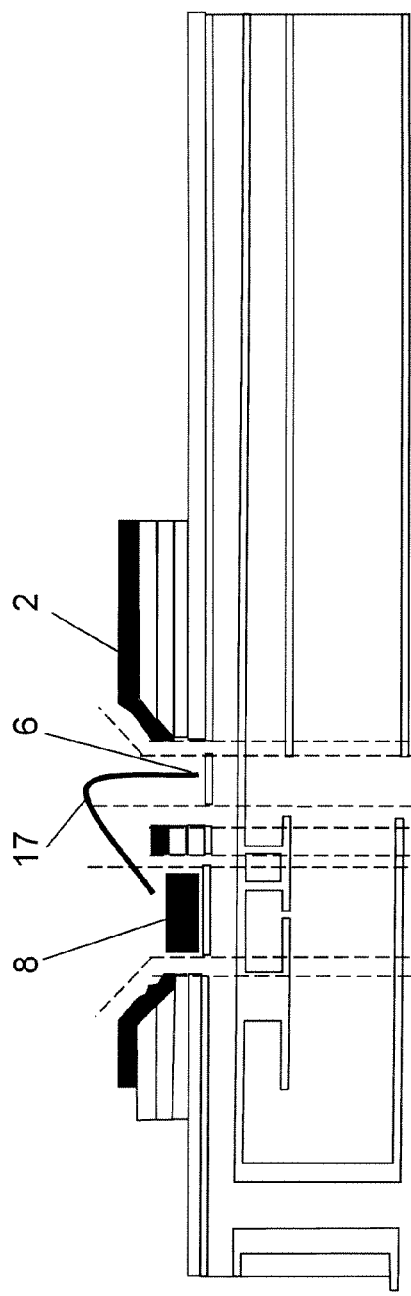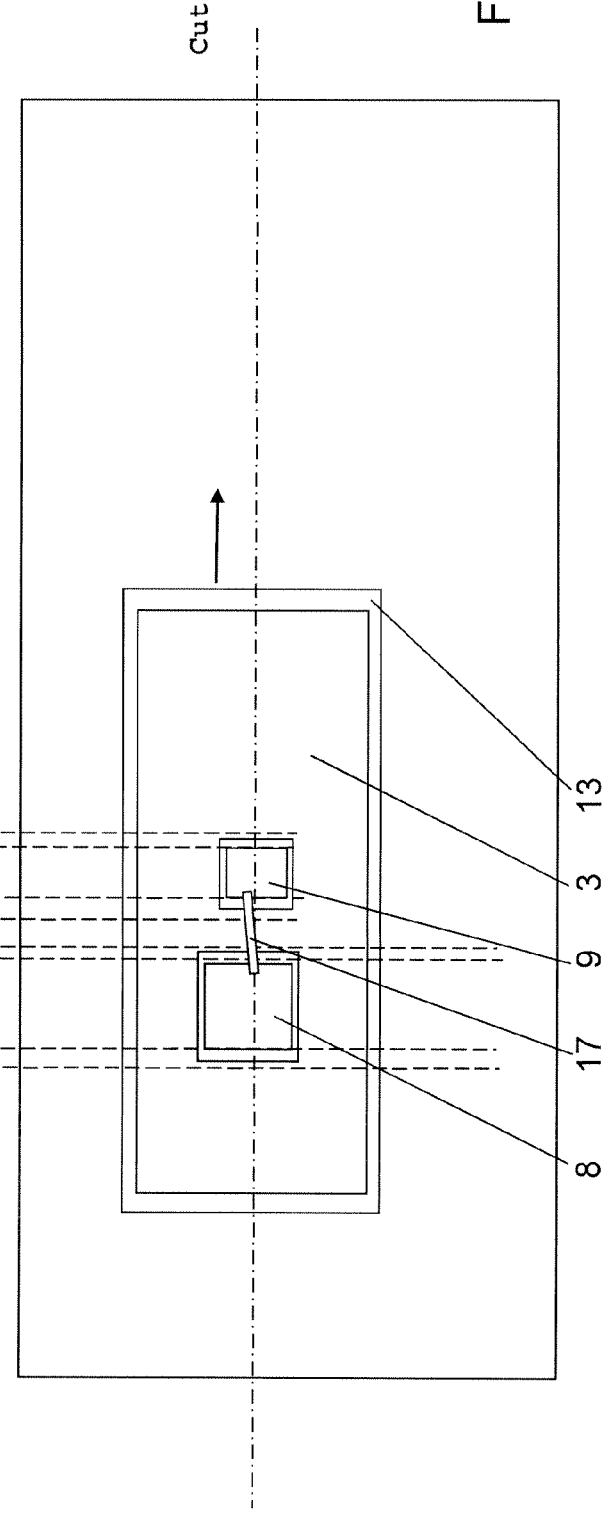

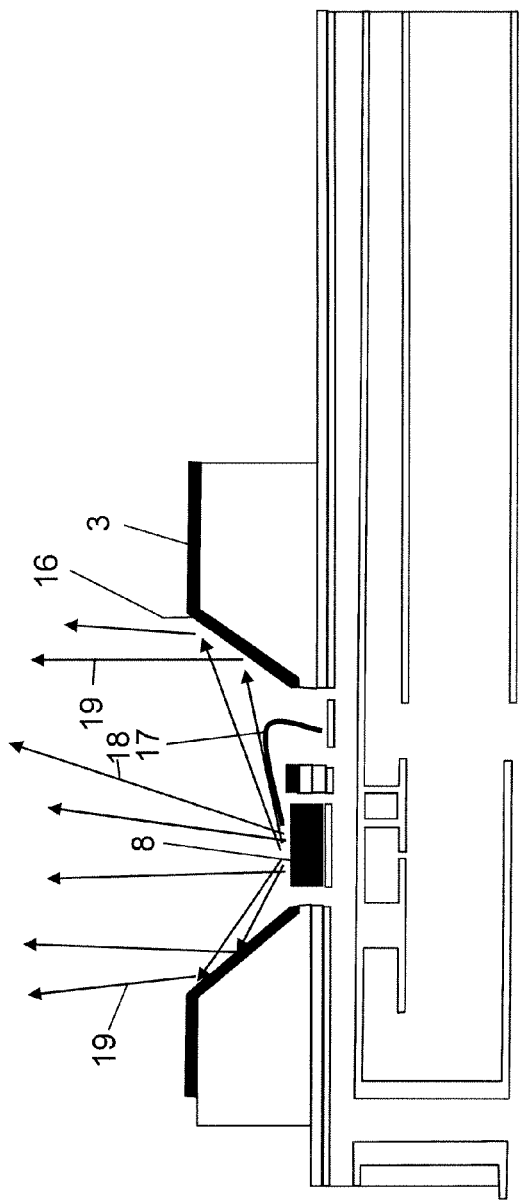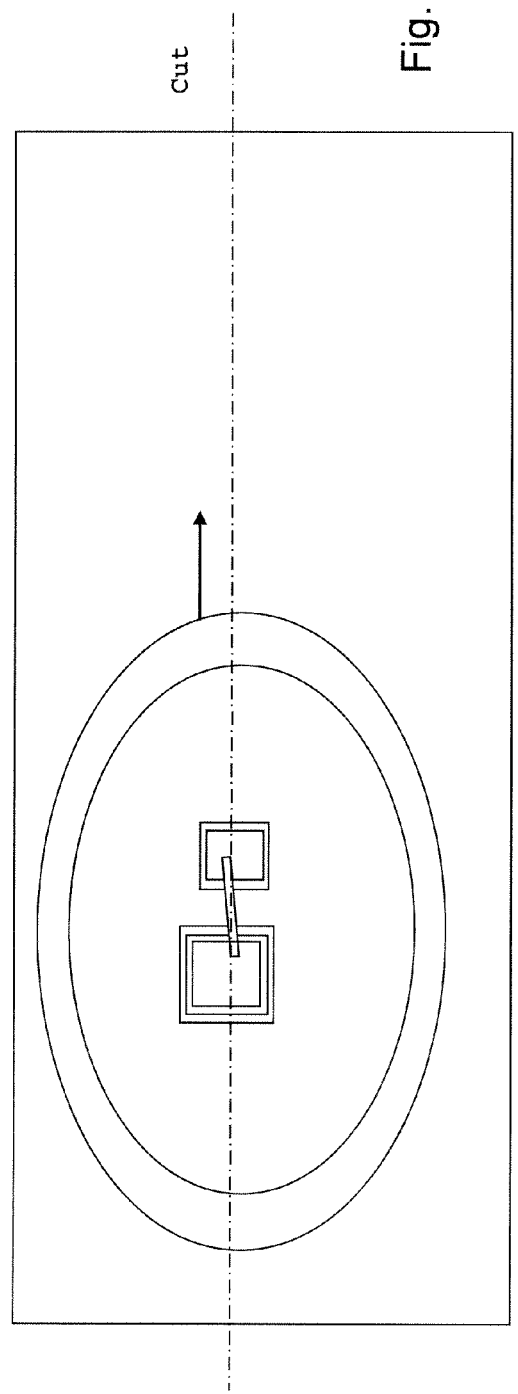

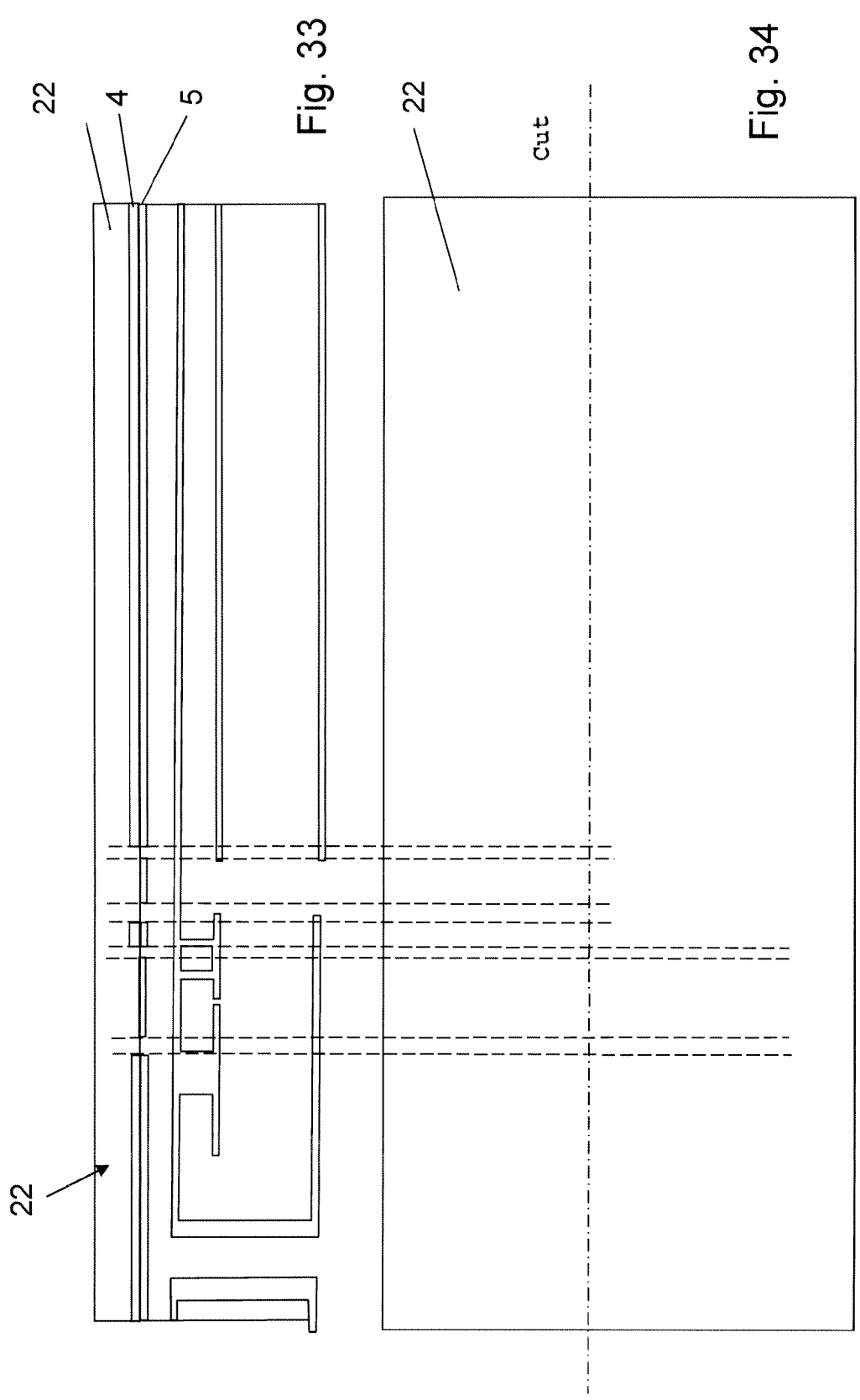

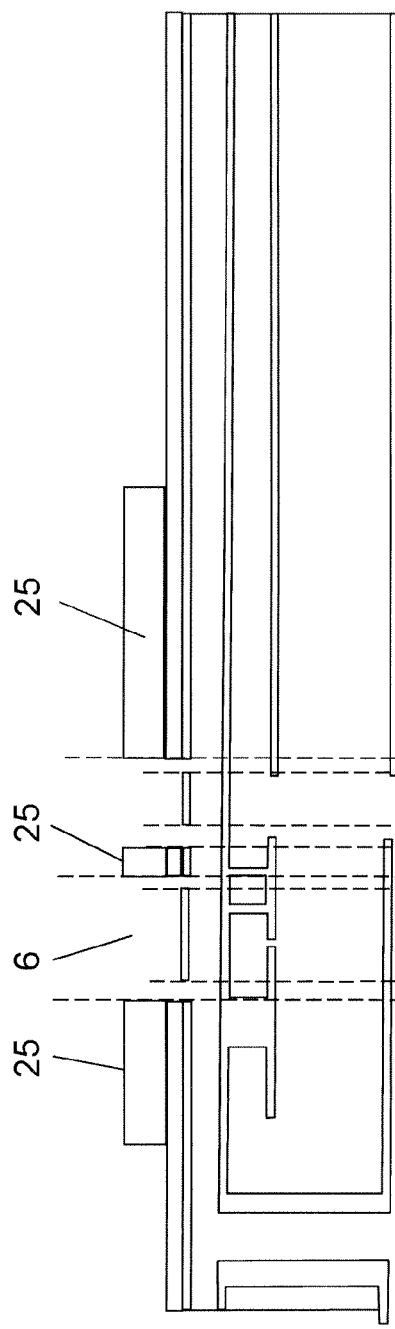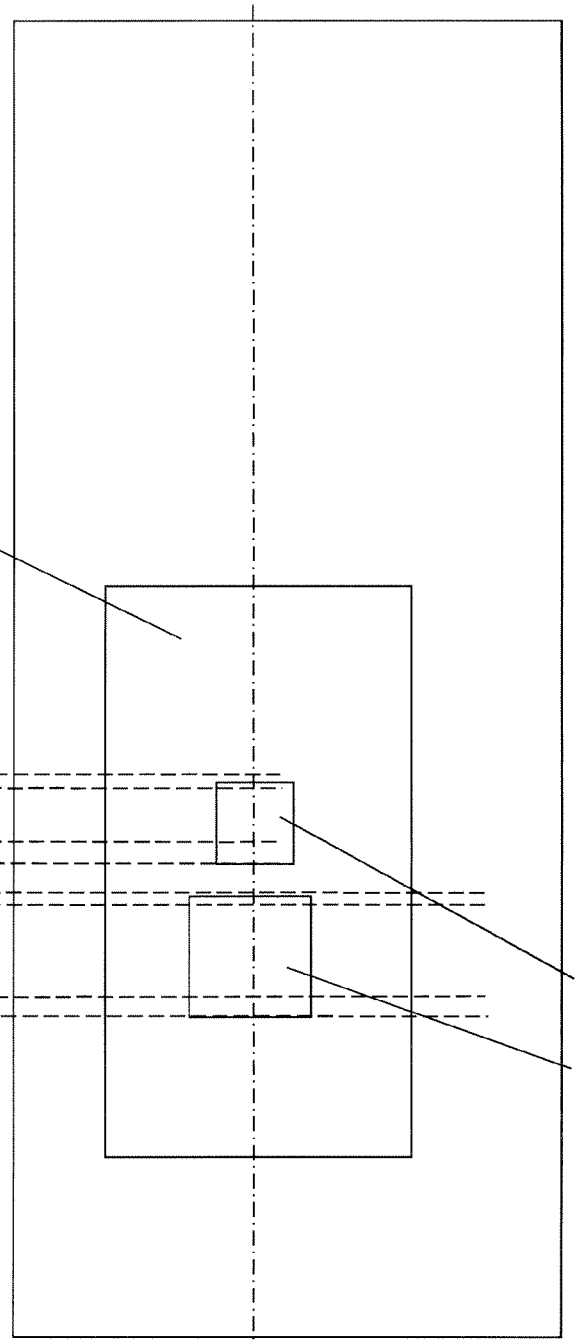

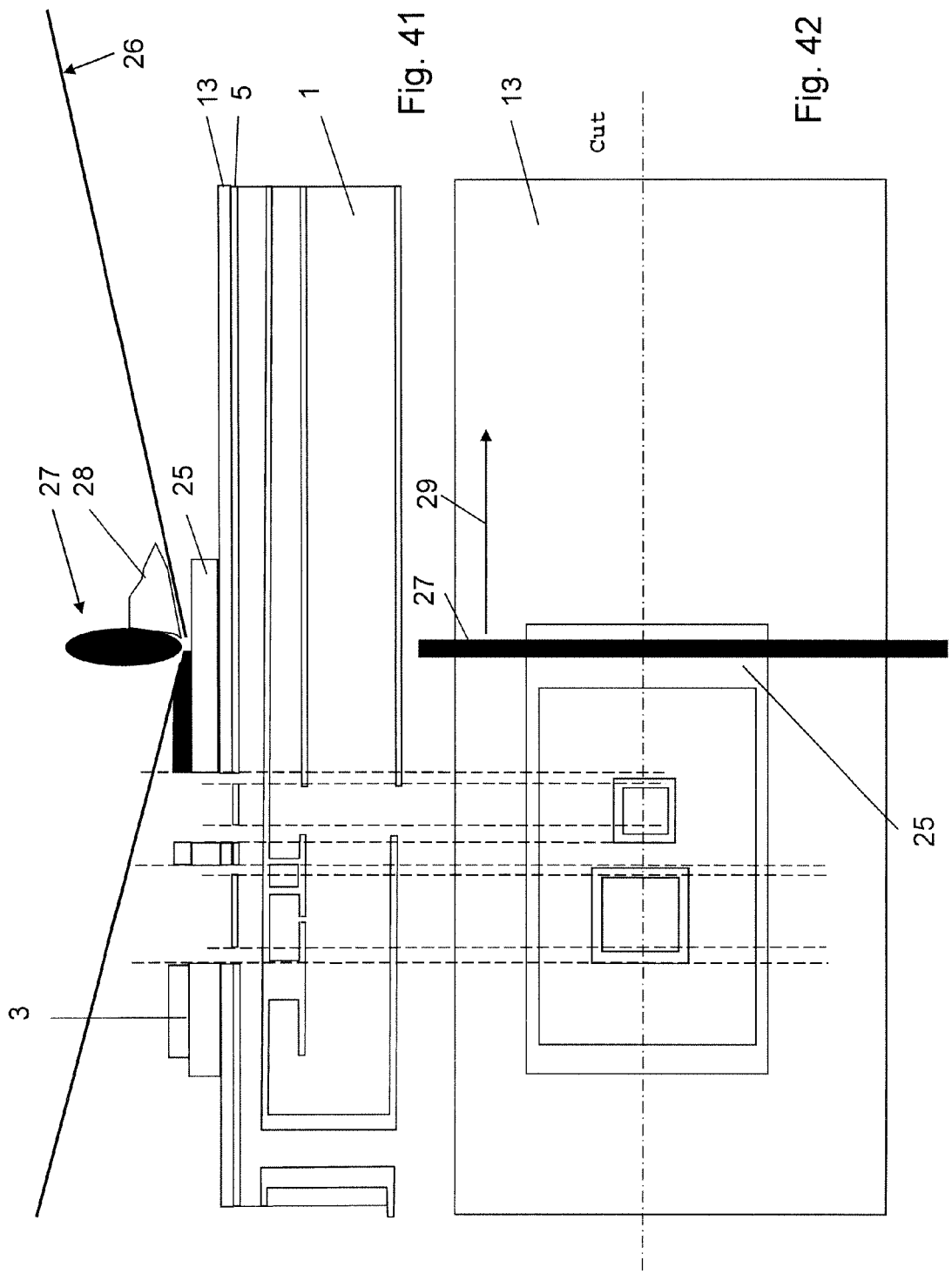

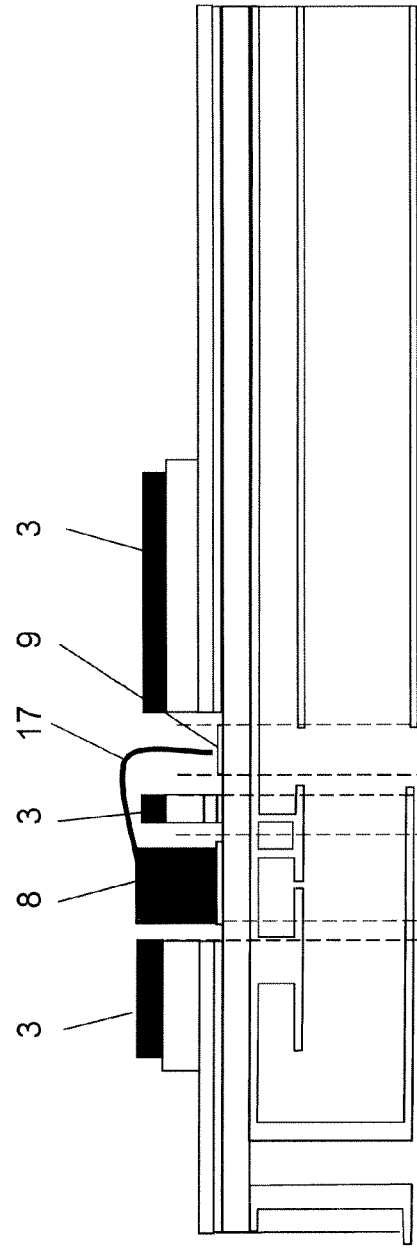
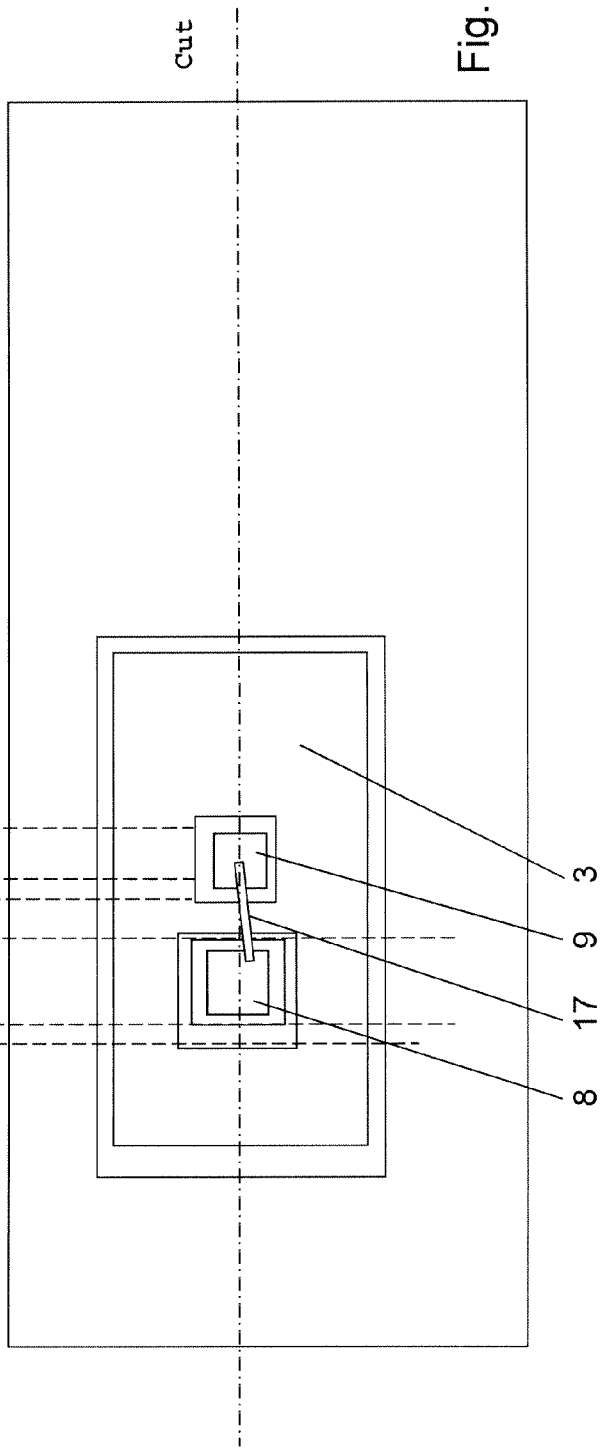
Fig. 43
Fig. 44

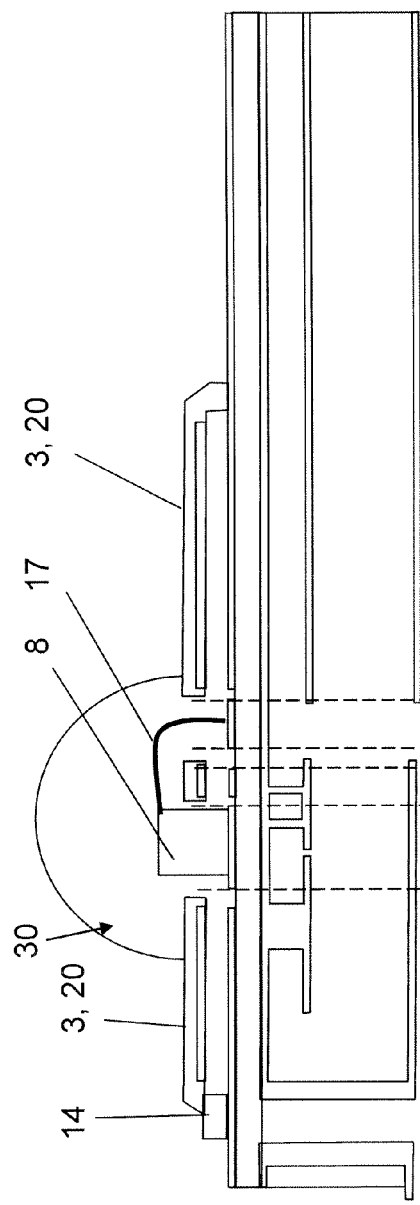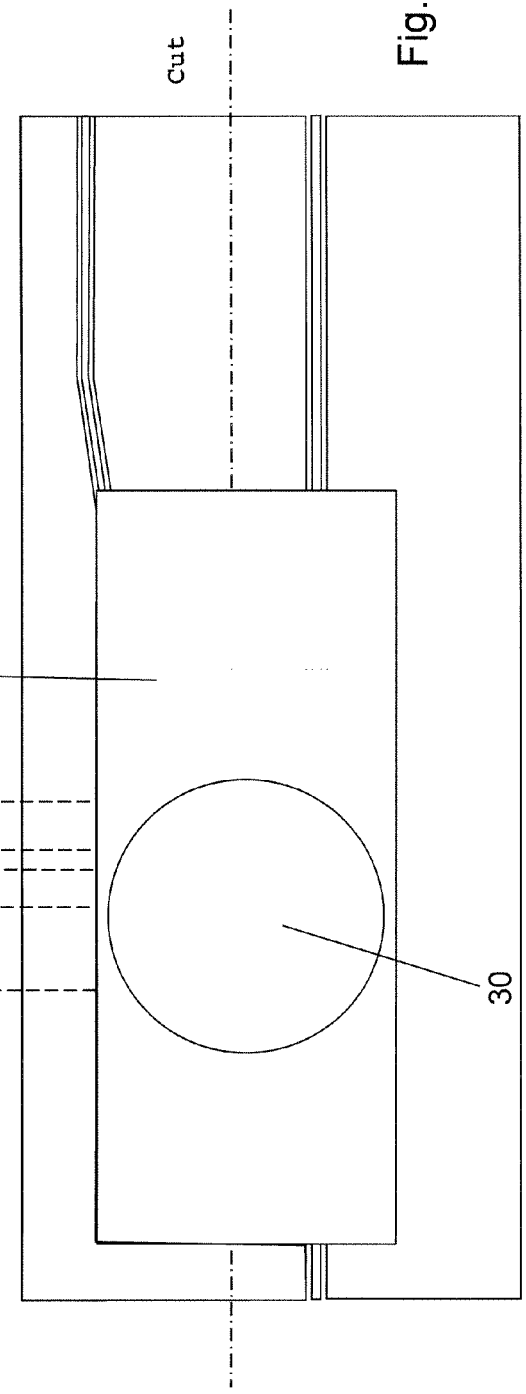

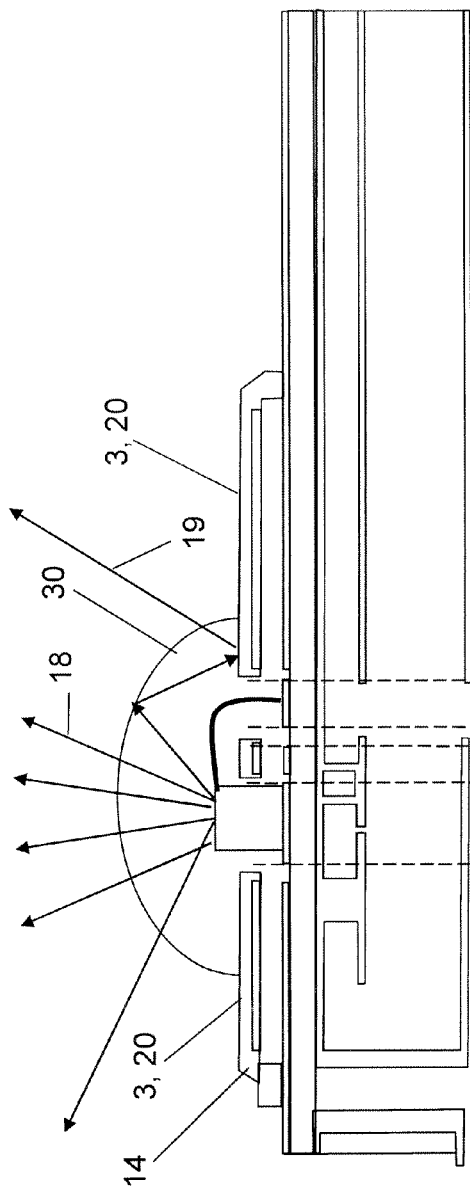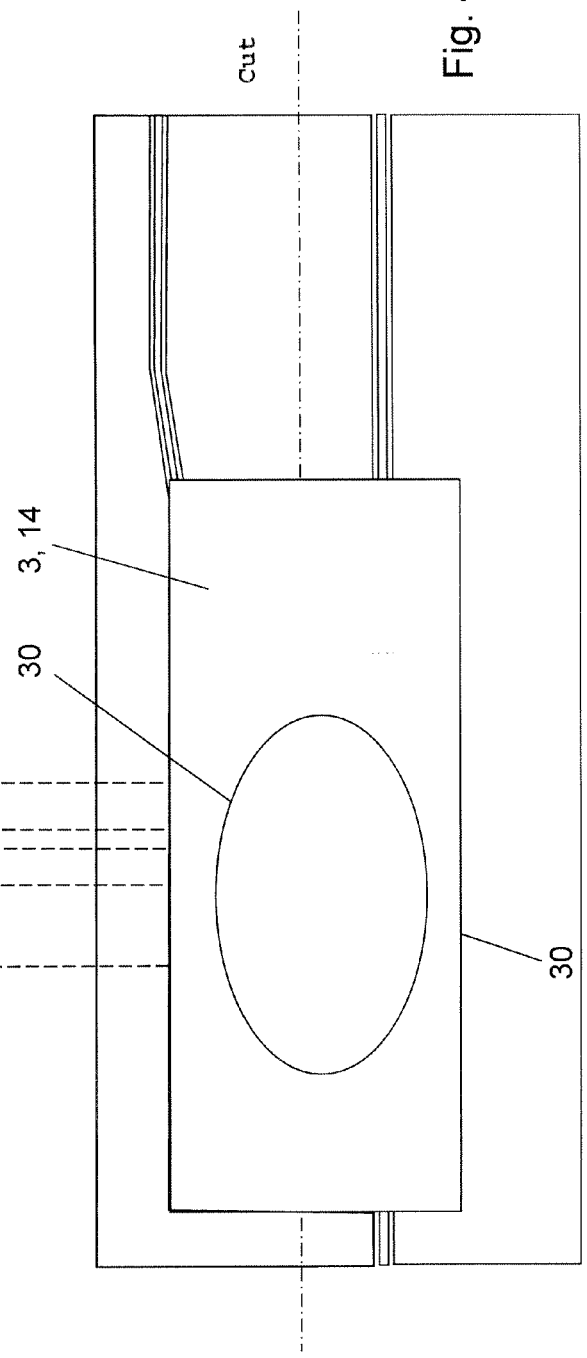

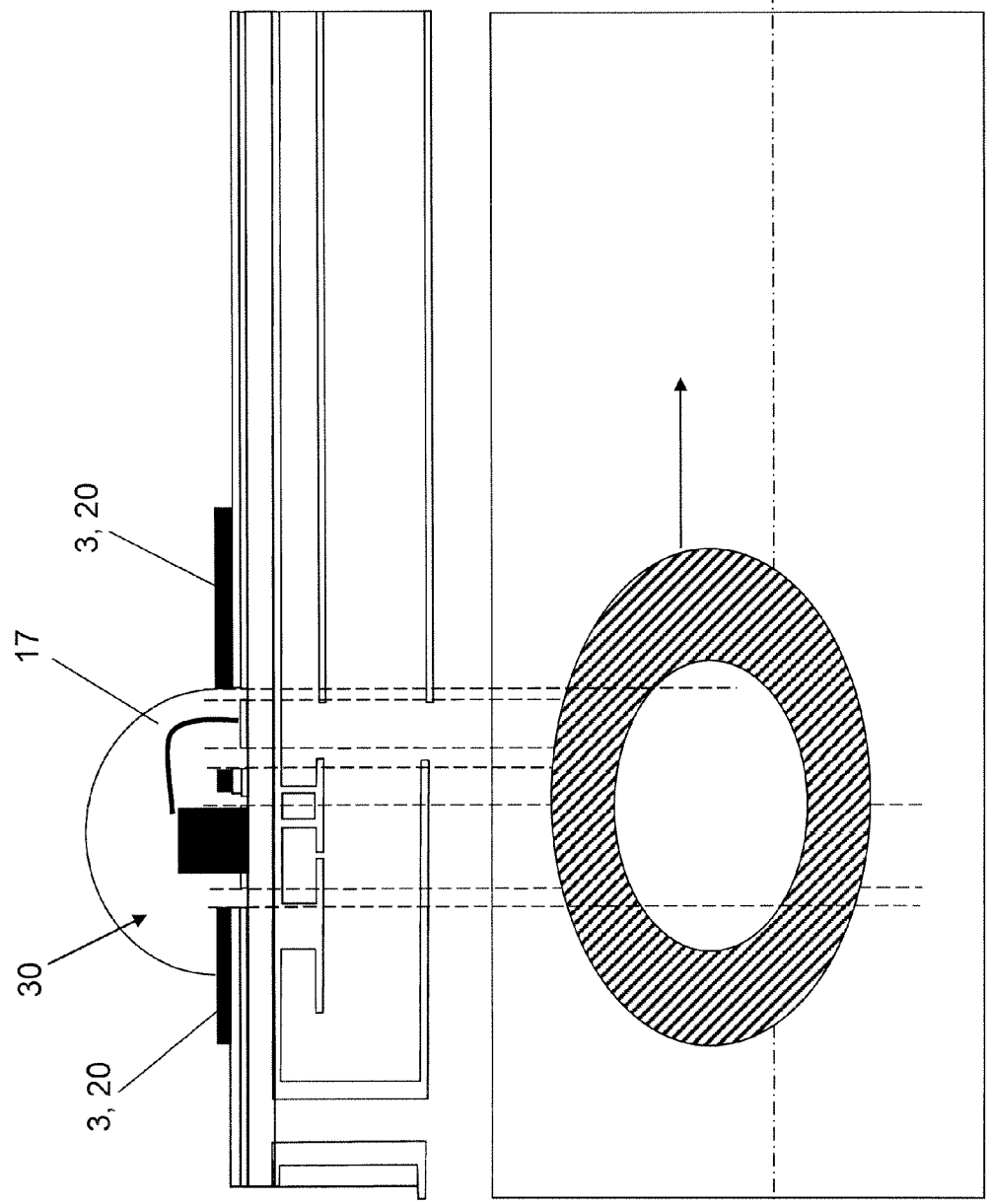

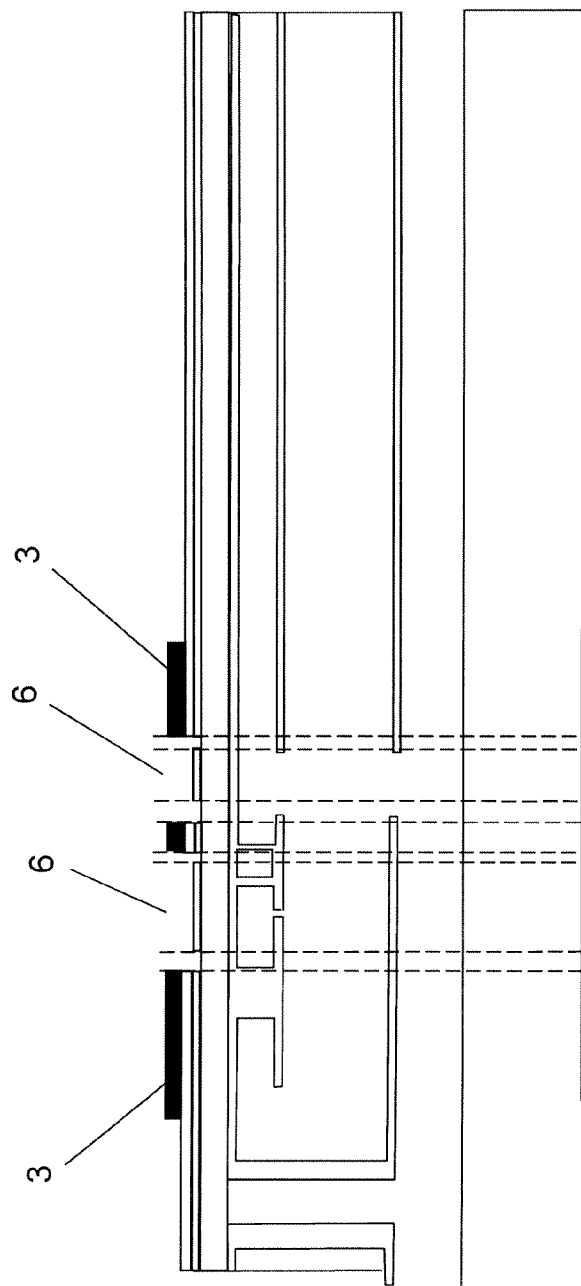
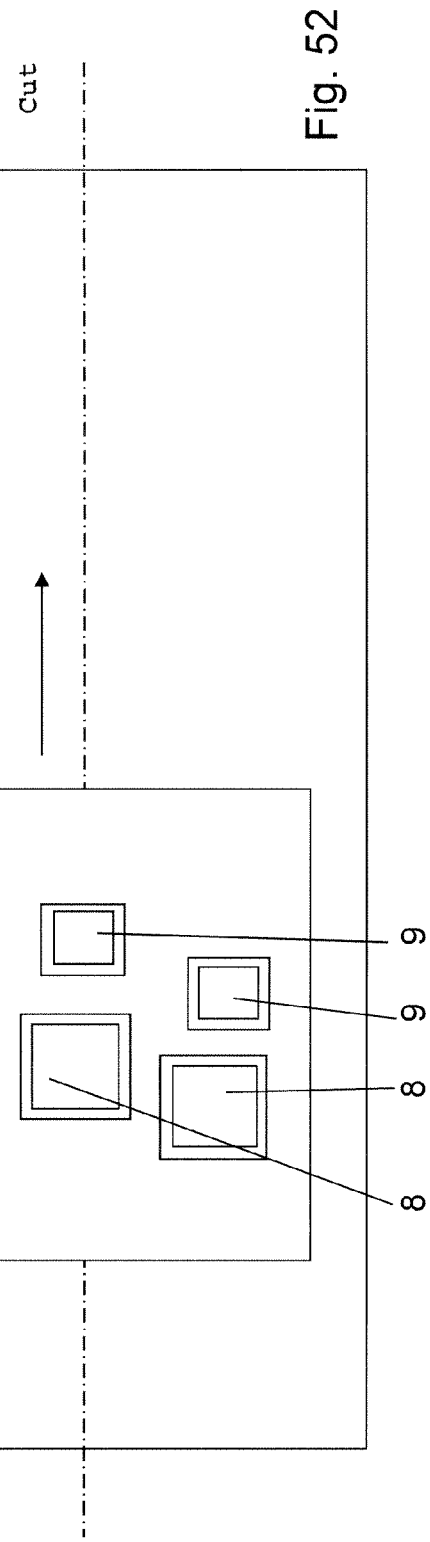
Fig. 51
Fig. 52

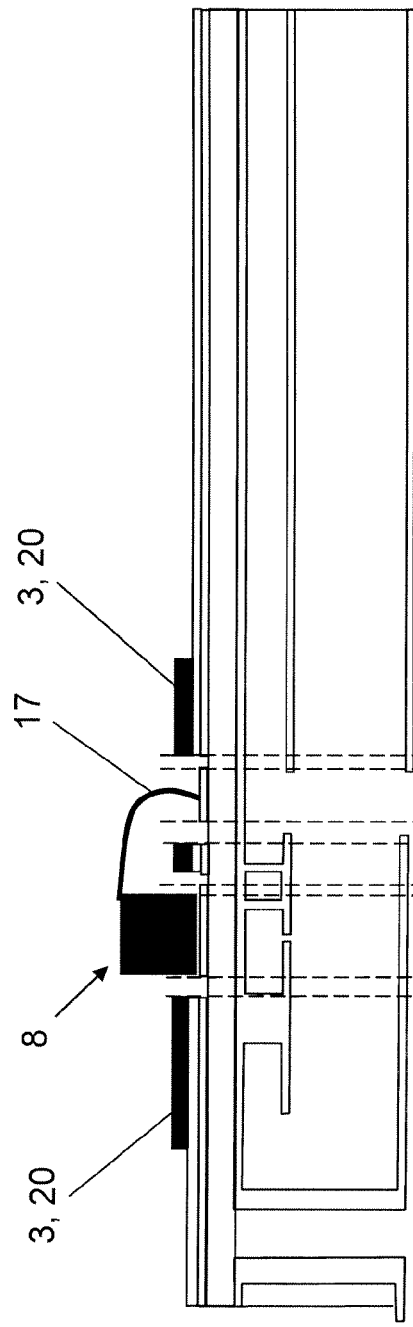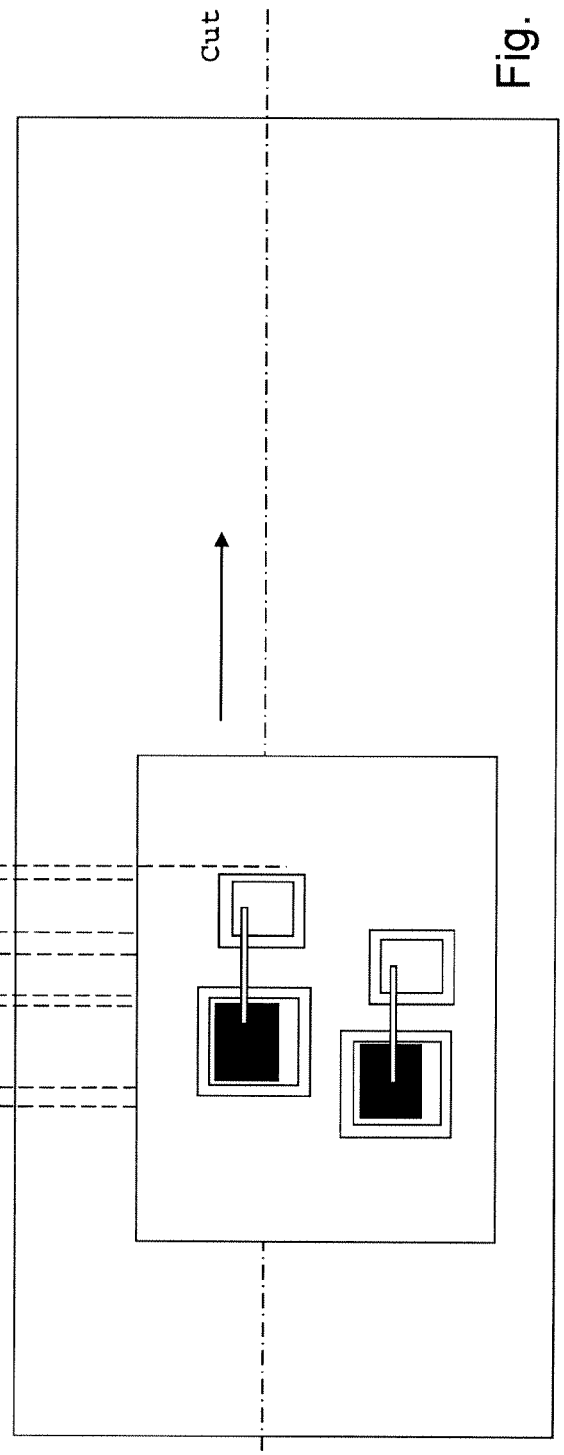

US 8,887,384 B2

METHOD FOR PRODUCING A CIRCUIT BOARD HAVING LEDS AND PRINTED REFLECTOR SURFACES, AND CIRCUIT BOARD PRODUCED ACCORDING TO THE METHOD

CROSS-REFERENCE TO RELATED APPLICATION

This application is related to and claims the benefit under 35 U.S.C. §119 and 35 U.S.C. §365 of International Application No. PCT/EP2010/002537, filed Apr. 24, 2010, the disclosure of which is expressly incorporated herein by reference.

Simple circuit boards consist of an electrically insulating core material (basis material), onto which one or two copper layers are applied. The thickness of the layer is normally 35 µm, and for applications with higher currents, between 70 µm and 140 µm.

For special applications, other materials may also be used, such as, for example, Teflon or ceramic in LTCC and HTCC for high frequency technology, as well as polyester foil for flexible circuit boards. The most recent developments also use glass as a basis material; for circuit boards with high requirements for heat dissipation, basis materials with metal cores are used, e.g. in the field of lighting technology with high-performance LEDs.

Some circuit board applications, in particular circuit boards populated with LEDs, require mirrors as reflectors, or to direct the light. Likewise, in some cases it is also desired that a specific light beam—e.g. visible light—be emitted from a circuit board. A reflector surface of circuit boards populated with LEDs having white light, with solder mask-paste for example, is currently known to have been created. A white solder mask-paste of this type has, however, poor reflectivity, and is difficult to mold when a bowed mirror surface is desired for generating a directed or focused light. Furthermore, the spectral radiation response is not optimal and the reflectivity in the UV range is poor.

When silver is used for reflective purposes of this type, the problem of undesired dendrite growth arises. For this reason, silver is not frequently used in the circuit board industry.

The invention therefore assumes the objective of disposing a reflector on a circuit board that is capable of generating directed light having a high degree of efficiency. Likewise, the invention assumes the objective of proposing a novel method for production of a circuit board with a reflective coating. To attain the stated objective, the invention is characterized by the technical teachings of claim 1.

It is important that a printed layer is disposed on the upper surface of a conventional circuit board (in particular on a solder mask or on the upper surface of an FR4-circuit board, consisting of epoxy resin+fiberglass cloth or a copper layer), which reflects light.

To obtain a particularly smooth mirror surface, it is provided that first a base layer is printed onto the substrate of the circuit board. A base layer of this type can also be three-dimensional in shape, in order, for example, to obtain a parabolic mirror. To protect the reflecting layer, it is further provided that the reflecting surface is coated with a transparent protective coating.

In a further embodiment of the invention, the following is provided:
In the lamination process, impressions are formed in the copper surface by means of specially designed pressing plates. Subsequently the copper surface may be provided with the appropriate surface through galvanization and/or electrochemically. The pacification is provided by means of a transparent polymer.

Alternatively, a noble metal surface with an oxide layer and/or a nitride layer may be used. This can then be protected with a so-called "blue" strippable lacquer (normally used for gold contacts), and then peeled off after the assembly process.

The subject matter of the invention for the present invention is derived not only from the subject matter of the individual claims, but also from combinations of the individual claims.

All information and characteristics, in particular the spatial design illustrated in the drawings, disclosed in the documentation are claimed as fundamental to the invention as long as they are individually, or in combinations, novel with respect to the prior art.

In the following, the invention shall be explained in greater detail based on illustrations showing only one means of execution. For this, further characteristics fundamental to the invention and advantages of the invention may be derived from the illustrations and their description.

FIG. 1: A cut through a first embodiment of a circuit board equipped with a reflector.

Figure 2:
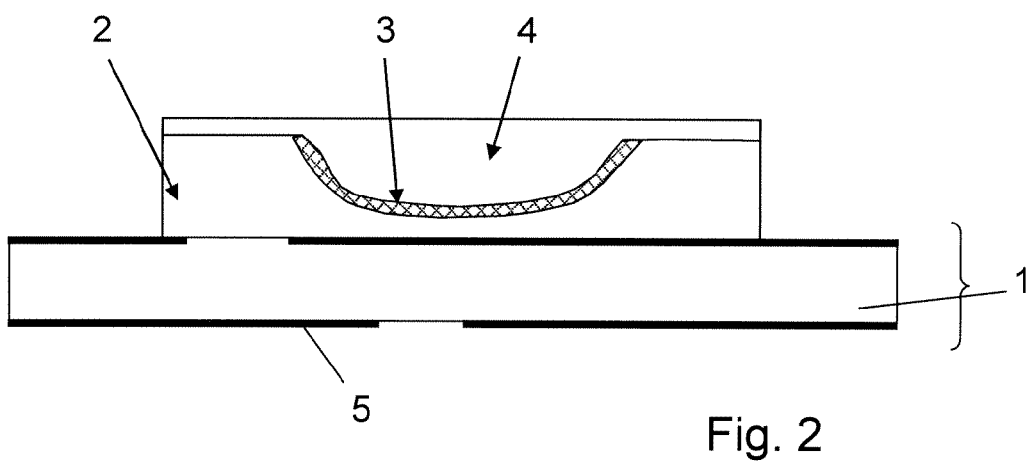

FIG. 2: An enlarged sectional view of the reflector construction.

Figure 3:
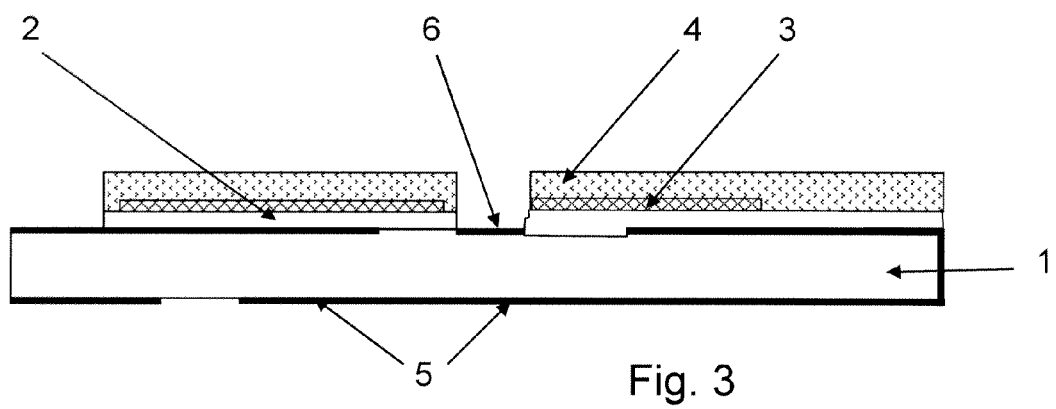

FIG. 3: A modified embodiment with a reflector and an opening for receiving an LED.

Figure 4:
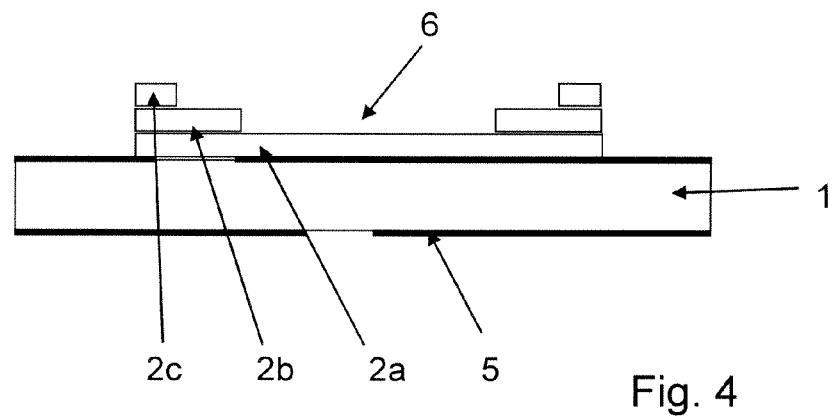

FIG. 4: A sectional view of the basic construction of the circuit board.

FIG. 5: A longitudinal section through a circuit board that is fully assembled from the electrical standpoint, prior to the further processing for reception of LEDs and reflector surfaces.

FIG. 6: Top view of the configuration in to FIG. 5.

FIG. 7: The same presentation as that in FIG. 5 with an illustration of the printing process with which a reflective coating is applied.

FIG. 8: The top view of the configuration in FIG. 7.

FIG. 9: An embodiment modified in relation to FIG. 7 in which the printed reflective coating is applied to a layer with insulating and dielectric ink.

FIG. 10: The top view of the configuration in FIG. 9.

FIG. 11: Another processing step, which follows the processing step of FIG. 9.

FIG. 12: The top view of the configuration in FIG. 11.

FIG. 13: The final processing step, which follows the processing step of FIG. 11

FIG. 14: The top view of the configuration in FIG. 13.

FIG. 15: A processing identical to that in FIGS. 5-14, in which, however, inclined reflection surfaces are created.

FIG. 16: The top view of the illustration in FIG. 15.

FIG. 17: The processing step following the processing step of FIG. 15.

FIG. 18: The top view of the configuration in FIG. 17.

FIG. 19: The final processing step, showing the finalization of the circuit board as a result of the processing step in FIG. 17.

FIG. 20: The top view of the configuration in FIG. 19.

FIG. 21: The equipping of a circuit board completed in accordance with FIG. 19 with an LED.

FIG. 22: The top view of the configuration in FIG. 21.

Figure 23:
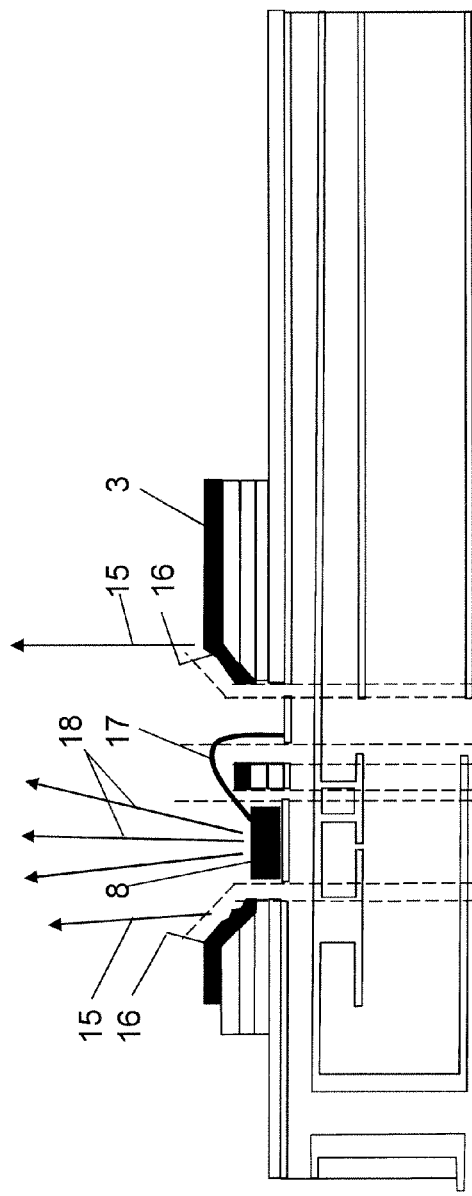

FIG. 23: The illustration of the light beam directions of the LED according to FIG. 21.

Figure 24:
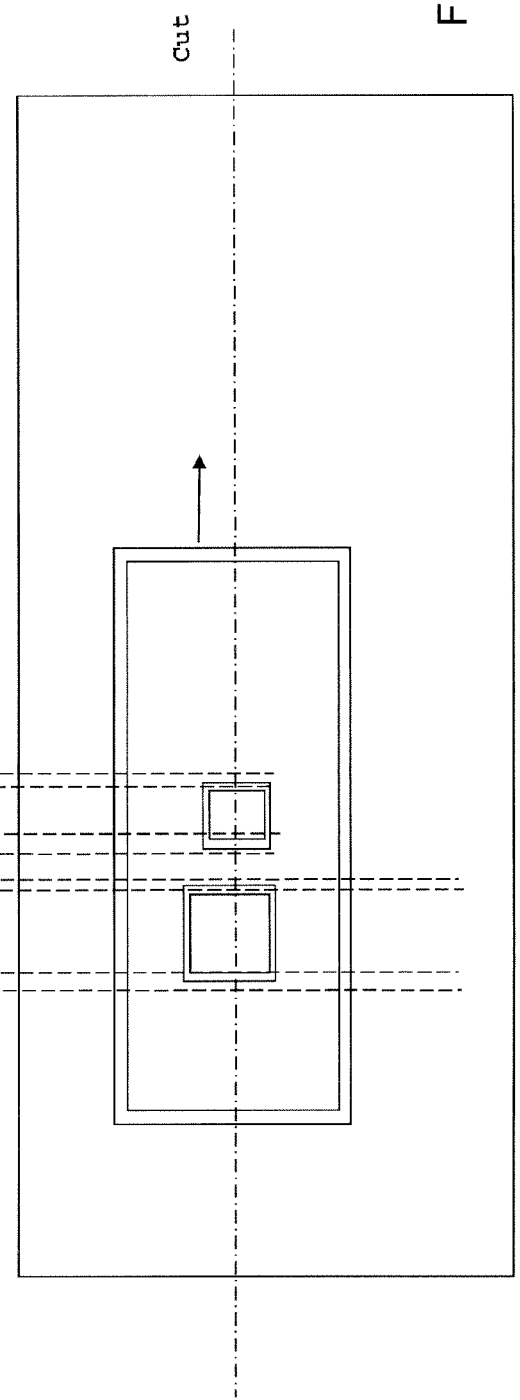

FIG. 24: The top view of the configuration in FIG. 23.

Figure 25:
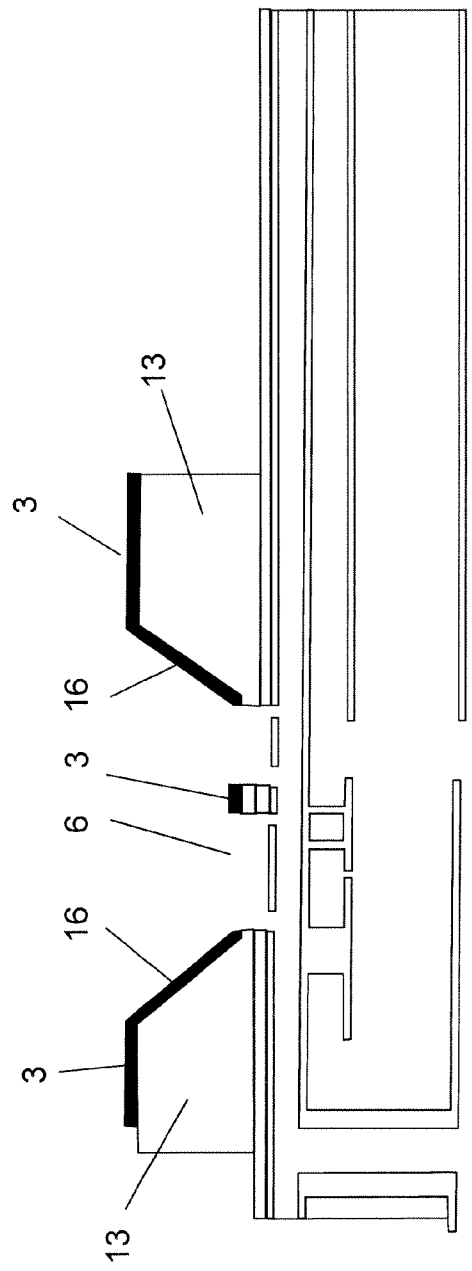

FIG. 25: An embodiment modified from the preceding embodiments, wherein the basis print, on which the reflecting reflection surfaces, which has been printed numerous times and having a thicker layer thickness.

Figure 26:
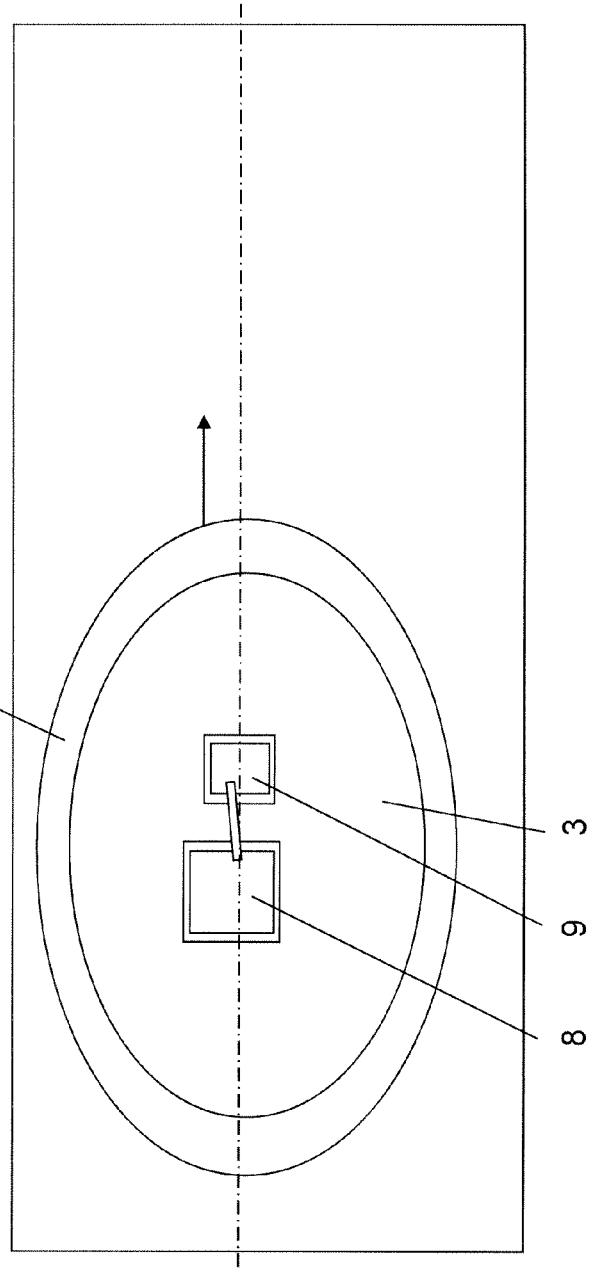

FIG. 26: The top view of the configuration in FIG. 25.

Figure 27:
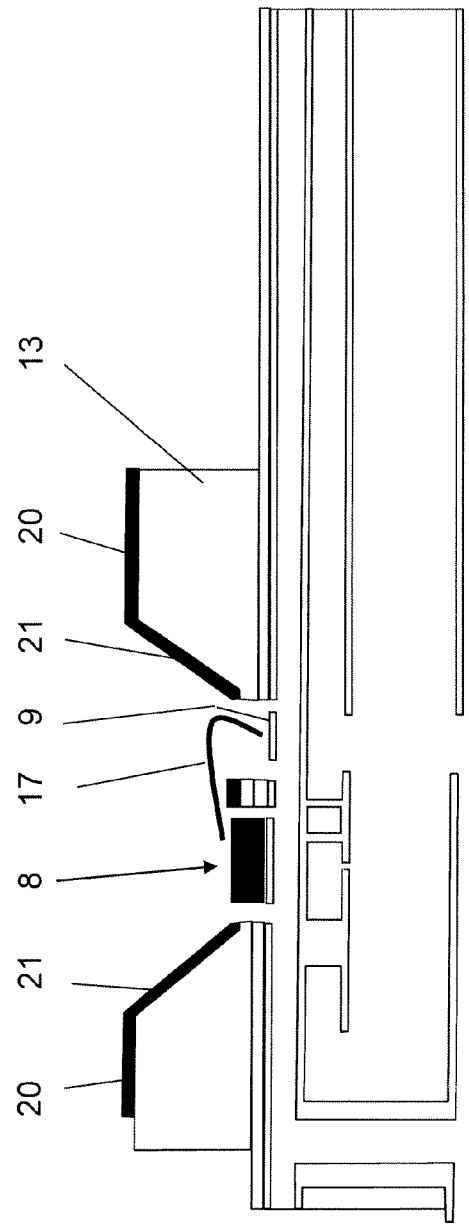

FIG. 27: The installation of an LED in the configuration in FIG. 25.

Figure 28:
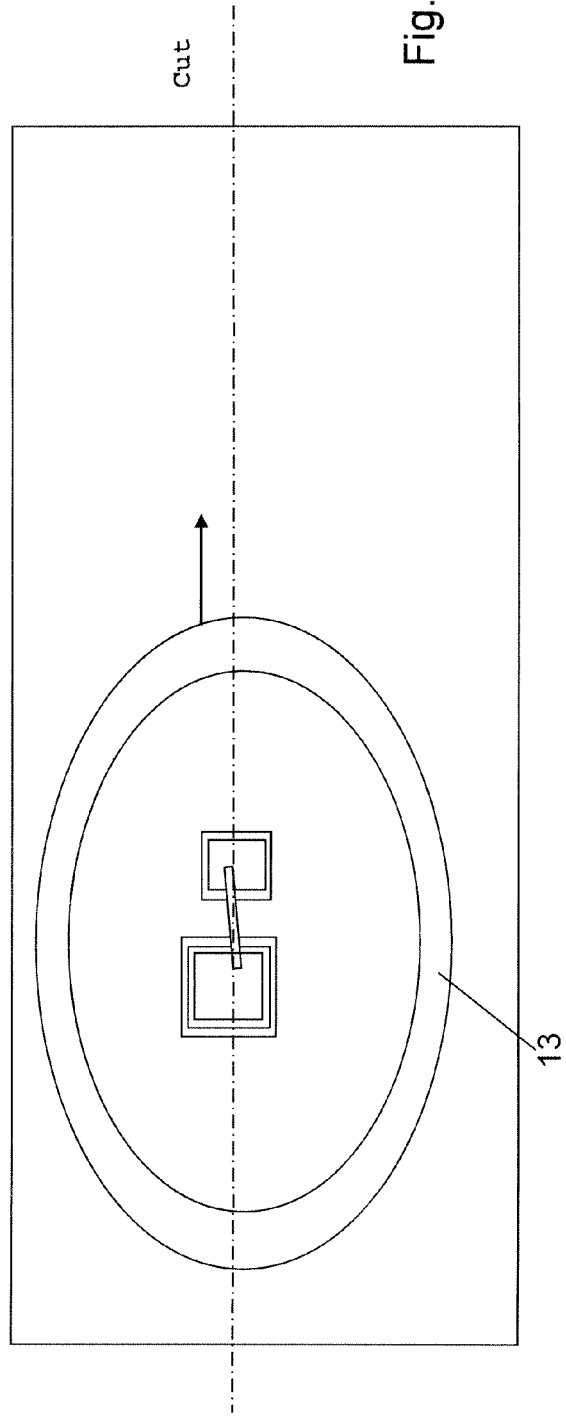

FIG. 28: The top view of the configuration in FIG. 27.

FIG. 29: the light direction of the installed LED of FIG. 27.

FIG. 30: The top view of the configuration in FIG. 29.

Figure 31:
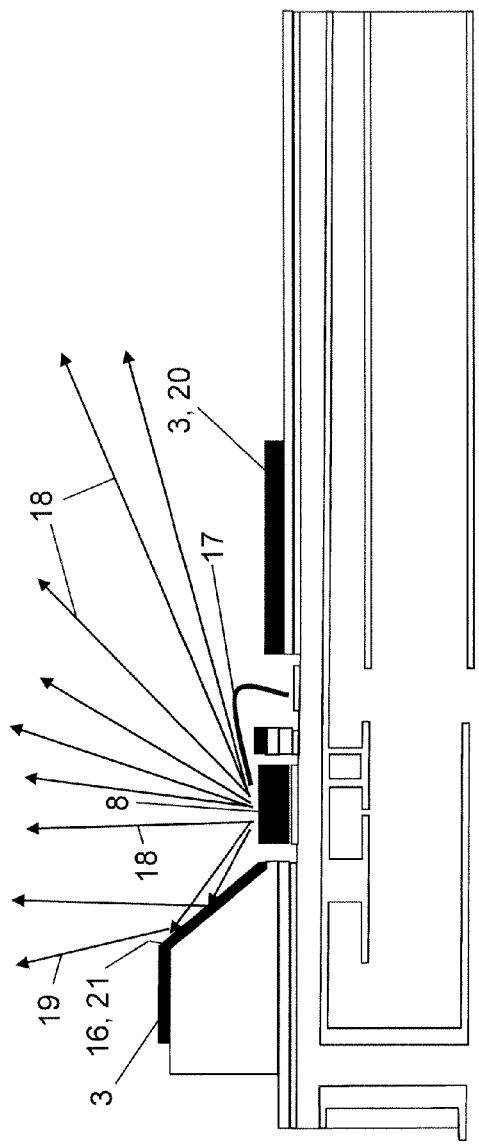

FIG. 31: The light direction of an LED installed according to FIG. 29 with a modified mirror surface.

Figure 32:
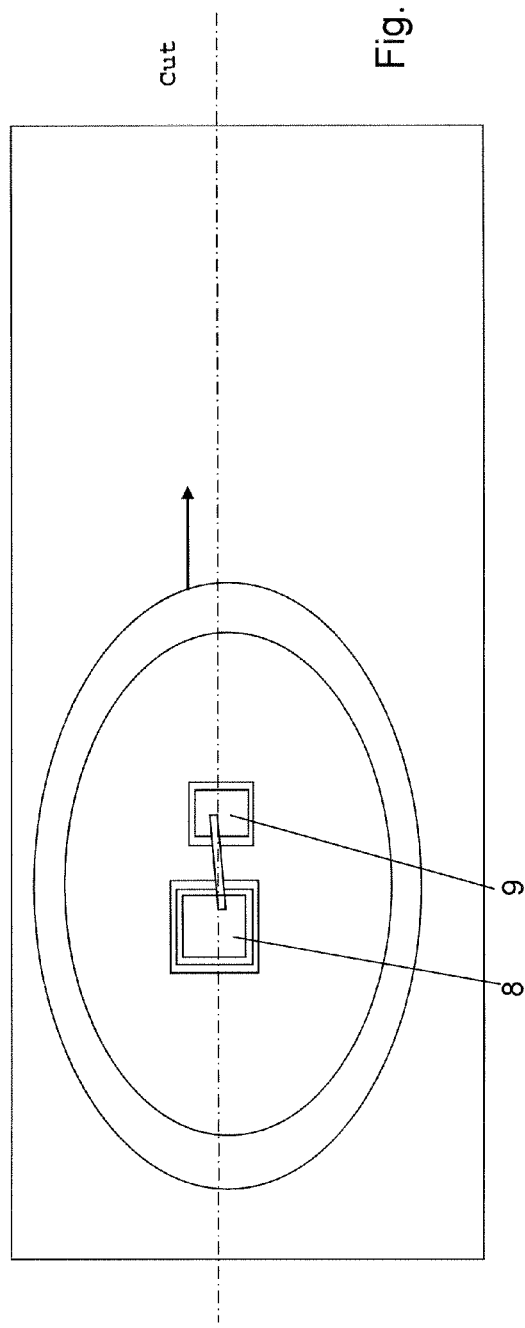

FIG. 32: The top view of the configuration in FIG. 31.

FIG. 33: An embodiment modified from that in FIG. 5 of a first processing step of an electrically conductively produced circuit board with a base layer applied by means of an immersion process.

FIG. 34: The top view of the configuration in FIG. 33.

Figure 35:
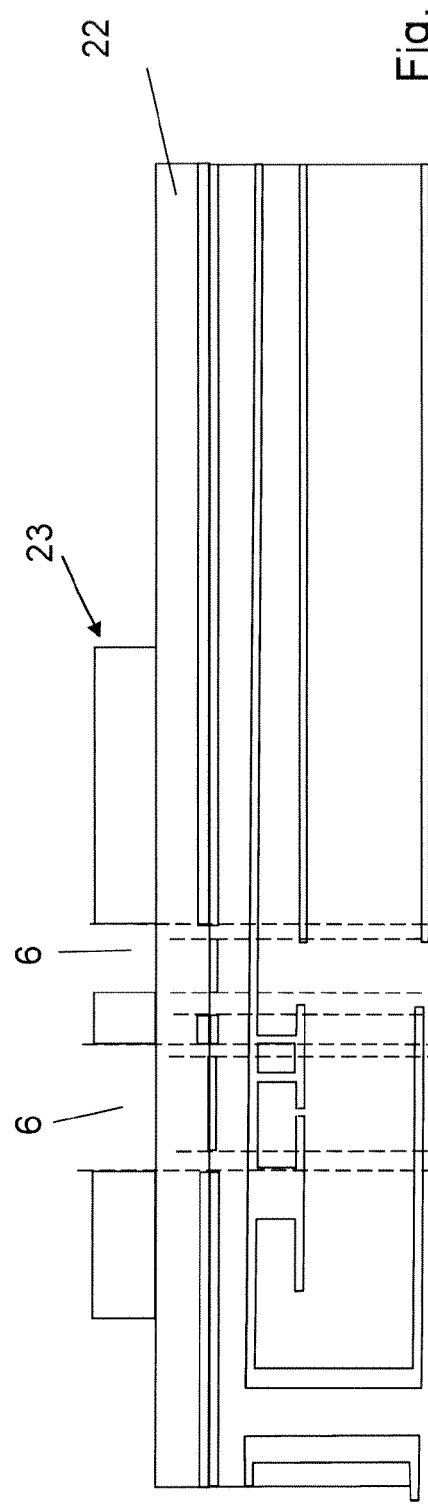

FIG. 35: The subsequent processing step to that in FIG. 33, with the application of a photosensitive film.

Figure 36:
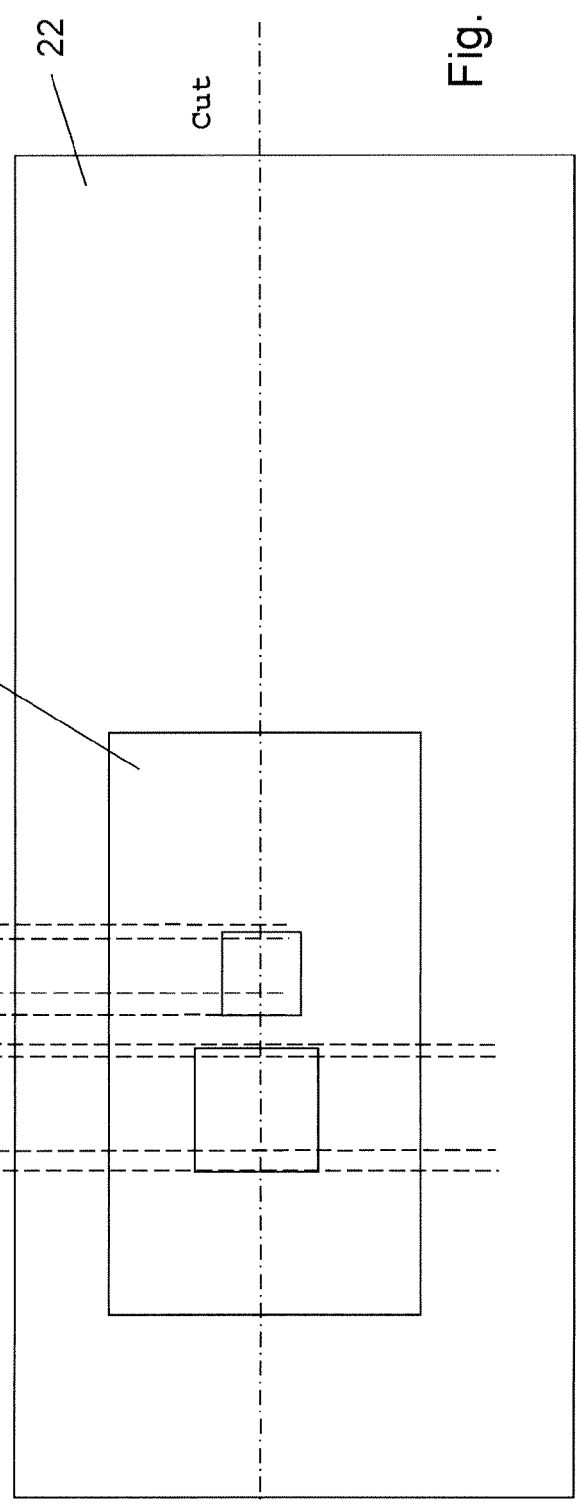

FIG. 36: The top view of the configuration in FIG. 35.

Figure 37:
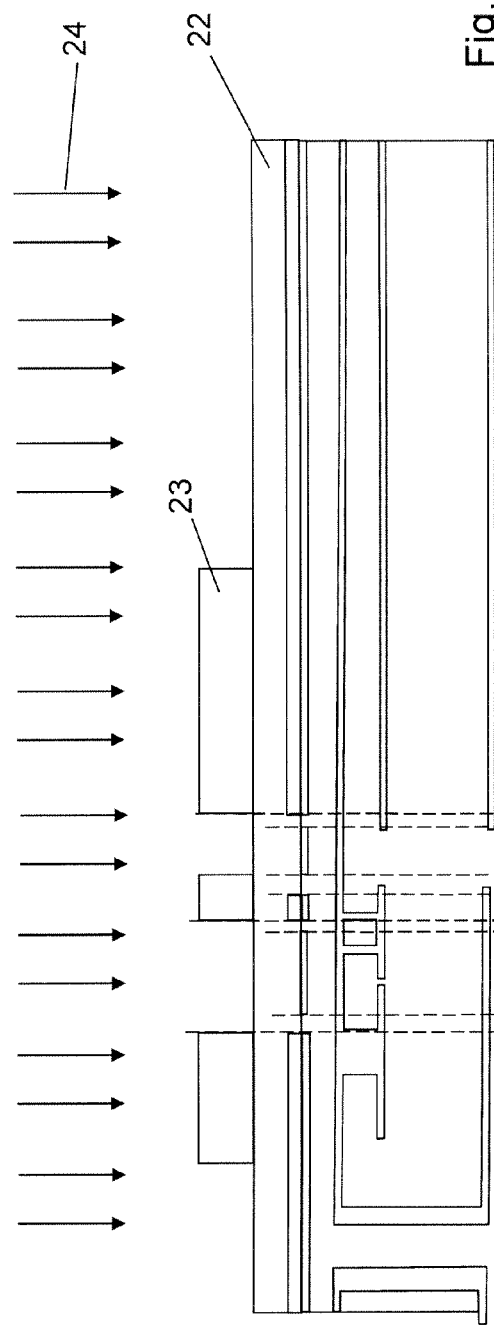

FIG. 37: The processing step following that in FIG. 35 in which the photosensitive film is exposed.

Figure 38:
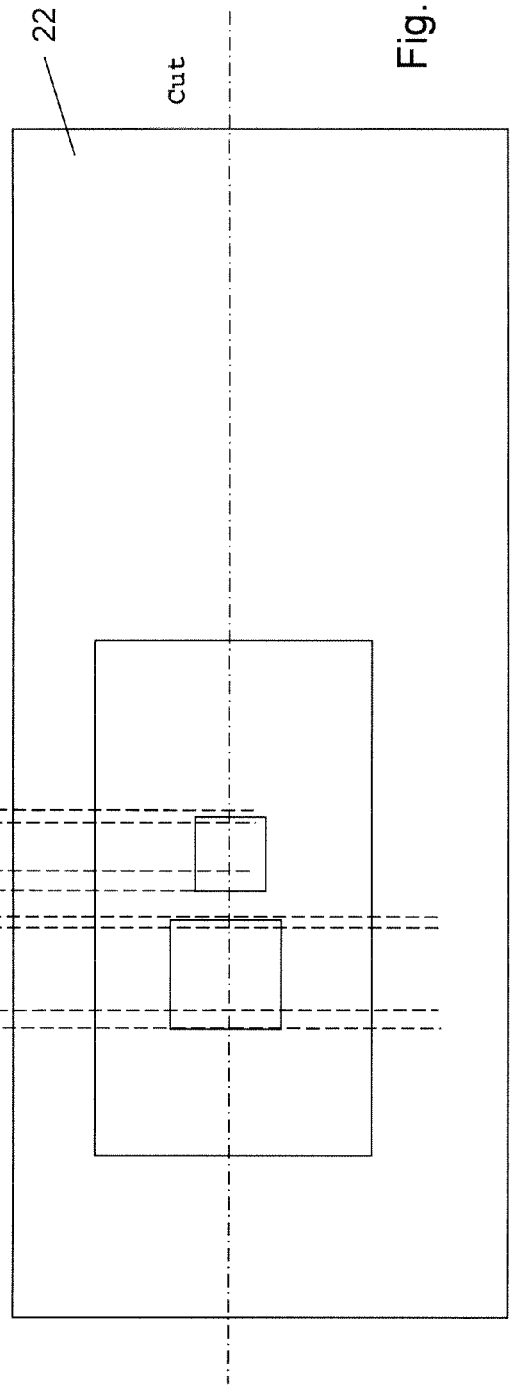

FIG. 38: The top view of the configuration in FIG. 37.

FIG. 39: The processing step subsequent to that in FIG. 37.

FIG. 40: The top view of the configuration in FIG. 39.

FIG. 41: The processing step subsequent to that in FIG. 39 with a reflector applied by means of a silkscreen printing.

FIG. 42: The top view of the configuration in FIG. 41.

FIG. 43: The processing step subsequent to that in FIG. 41 with the installation of an LED.

FIG. 44: The top view of the configuration in FIG. 43.

FIG. 45: The processing step subsequent to the process in FIG. 43 with the covering of the LED with a color conversion layer.

FIG. 46: The top view of the configuration in FIG. 45.

FIG. 47: The light beam path of the LED resulting in FIG. 45.

FIG. 48: The top view of the configuration in FIG. 47.

FIG. 49: An embodiment of a reflector surface modified from that in FIG. 47.

FIG. 50 The top view of the configuration in FIG. 49.

FIG. 51: The sectional cut through a circuit board with a reflector surface for the installation of numerous LEDs.

FIG. 52: The top view of the configuration in FIG. 51.

FIG. 53: The processing step subsequent to that in FIG. 51, showing the installation of two LEDs.

FIG. 54: The top view of the configuration in FIG. 53.

Figure 55:
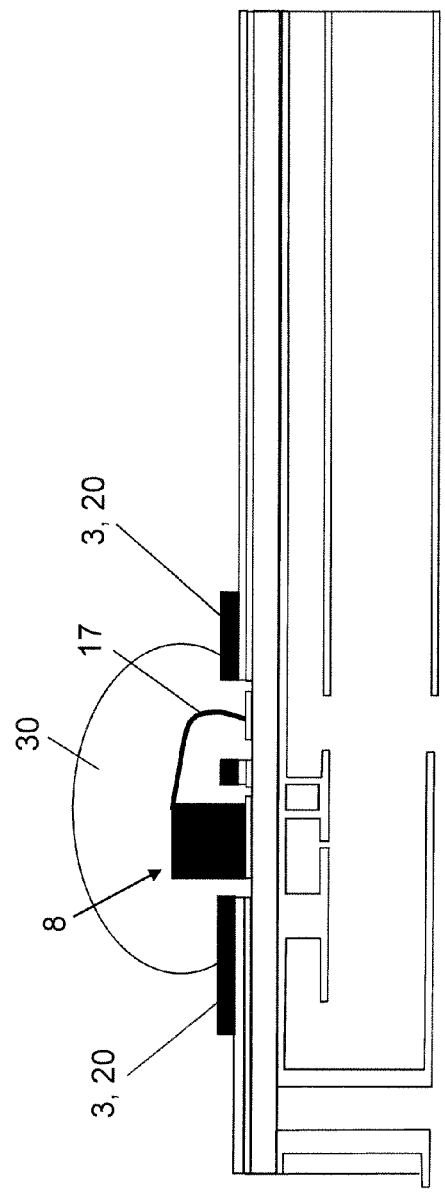

FIG. 55: An embodiment further developed from that in FIG. 53, showing the configuration in FIG. 53 with an additional color conversion layer.

Figure 56:
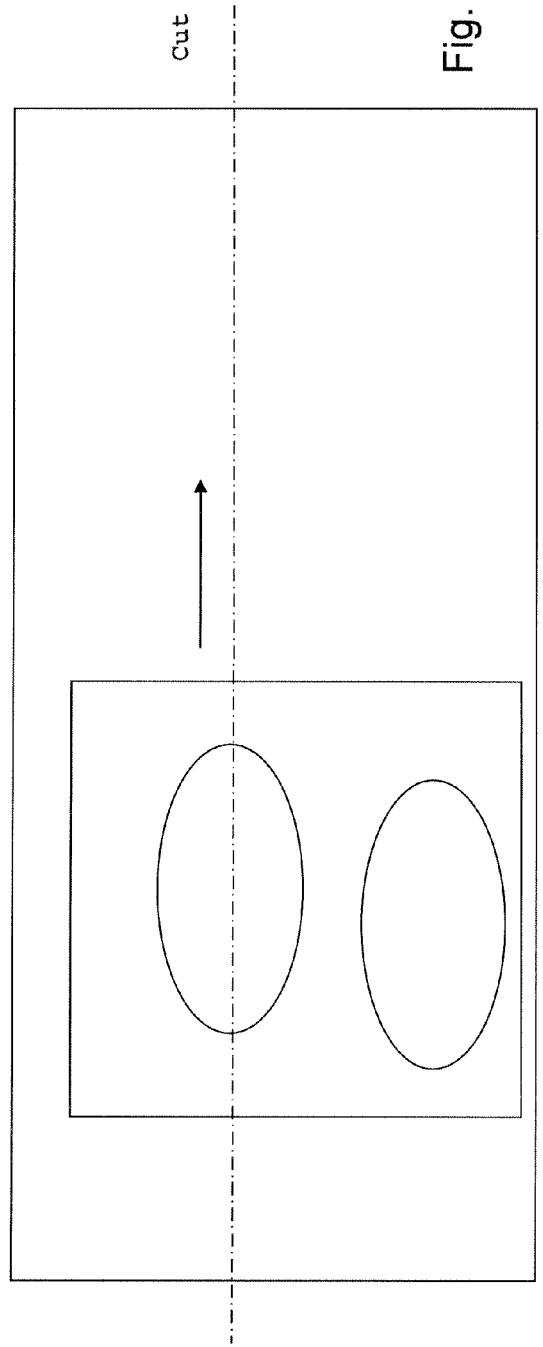

FIG. 56: The top view of the configuration in FIG. 55.

Figure 57:
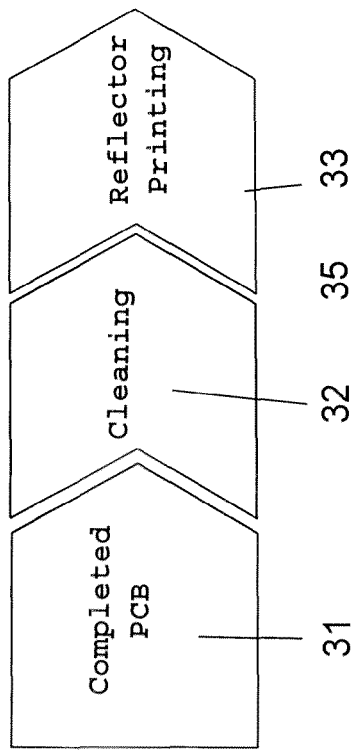

FIG. 57: A schematic diagram of the process flow for the production of the circuit board according to the invention, with mirror surfaces.

Figure 58:
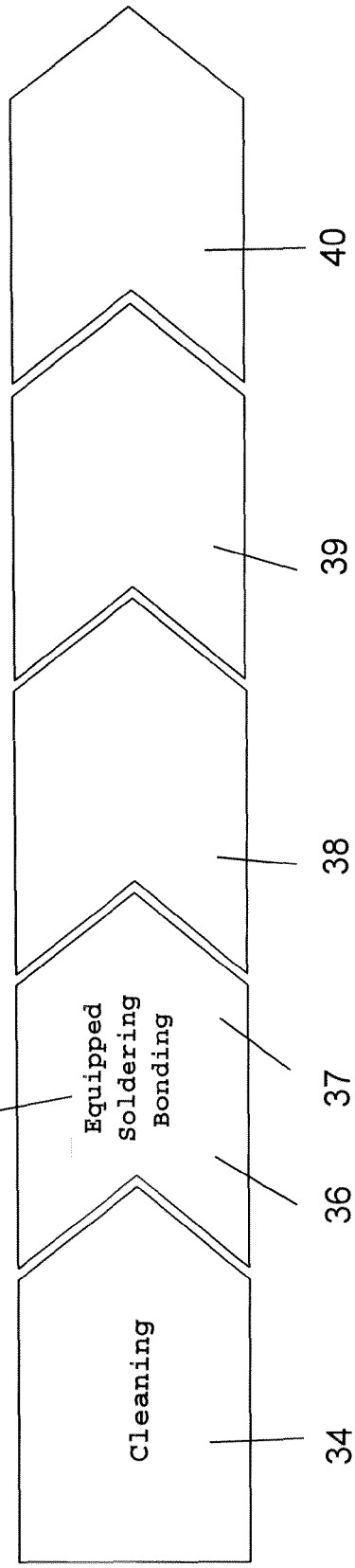

FIG. 58: A schematic diagram of the process flow for possible further processing of a circuit board in accordance with the disclosure.

According to FIG. 1, the base layer 2 can be applied to the upper surface of a circuit board 1 independently of whether or not the upper surface is structured.

In some applications a solder mask or another layer may be used as a base for the reflective coating 3. In this case, the base layer 2 may be omitted.

In any case it must be ensured that the surface (base layer 2) supporting the reflecting surface forms a smooth surface and/or forms a good bond for the overlying three-dimensionally shaped reflector surface 3.

The base layer 2 can be applied with various printing techniques, in particular inkjet printing, silkscreen printing and any other printing methods such as pad printing, relief printing, gravure printing or the like. For the assembly of the circuit board, curtain coating, roller coating, and lamination methods are known in particular, which generate an appropriate structure, including a photographic exposure method. All of these methods are used and claimed as fundamental to the invention, either individually or in combinations thereof for the production of the molded base layer.

The reflector surface 3 for the generation of visible light is preferably applied by a printing method. A reflective coating consists preferably of a metallic, quick drying ink composition, in particular silver, gold aluminum, and all other suitable metals. Likewise, non-metallic materials are used, which are suited for reflecting light in a specific wavelength range, wherein wavelength ranges in non-visible ranges may also be used.

For the application of said, printing methods such as inkjet printing, silkscreen printing, pad printing and other application printing methods are used in particular. Likewise, a base layer 2 may serve as the base layer for a subsequent wet application process for layered wet chemical application of the reflective coating 3. In this case, a silver layer, for example, may be used as a primer coat for the subsequent application of an electroplating containing copper.

In another variation, the application of the three-dimensionally shaped reflective coating 3 is provided by means of a structuring photographic exposure.

If, after the production of the reflective coating 3, an undesired coarseness exists, this can be removed by means of electropolishing or by means of a wet chemical smoothing.

To establish the efficiency of the reflection, and possibly the bonding to the base layer 2 or to the overlying cover layer 4, as well, it is provided that the reflective coating 3 consists of numerous layers. In another design of the invention it is provided that the three-dimensionally shaped mirror is prepared in advance, and subsequently affixed to the surface of the circuit board.

The aforementioned cover layer 4 over the reflective coating 3 is optional. The base layer 2 and the cover layer 4 may be made of the same material, but this is not necessary. The cover layer 4 can be transparent or colored and may serve as a color filter.

The application of the protective cover layer 4 is provided to protect the reflective coating 3 from decomposition or damage through mechanical impact, chemical effects, gas, air or moisture. The cover layer 4 can be applied by means of application methods such as, preferably, inkjet printing, silkscreen printing, application printing and any other printing methods. Likewise, a photographic exposure application may also be used.

The cover layer 4 may cover only the reflective coating 3, or it may cover the reflective coating 3 and the base layer 2 as well, or only a portion of the reflective coating 3.

FIG. 2 shows a modification of the structure in FIG. 1. In this case as well, all of the variations described with regard to FIG. 1 may also be used here. The curvature of the reflective coating 3 can be either positive or negative (convex or concave). The curvature can be produced by shaping a primary layer. In another variation, the circuit board 1 itself can be bowed. A curvature of this sort can be obtained by means of a molding process or a thermoforming process.

FIG. 3 shows another embodiment of a circuit board 1 with a reflective surface, which is equipped with an LED chip in a recess 6 in the reflective coating 3. The curvature can be obtained either through mechanical shaping, e.g. compression molding, stamping, milling, or other machining processes. In another embodiment, the bowing can be obtained by means of application methods, such as inkjet printing or pad printing. In this case, the base layers 2a, 2b, 2c are laminated to one another to obtain the desired curvature (cf. FIG. 4).

In FIG. 3 it is not necessary to have only one recess 6 for accommodating the LED chip. In another embodiment, numerous recesses 6 for receiving LED chips or connecting leads or other connections may be provided.

FIGS. 5 and 6 show a multi-layered circuit board with completed electronics, consisting of a laminated construction of a circuit board substrate 1, which normally consists of an insulating synthetic material, in particular a resin.

In the laminated structure of the circuit board substrate there are numerous conductors made of copper, forming the conductive connections between the electric components which are to be installed on the circuit board.

According to the invention, it is provided that the uppermost conductor, or conductor layer 5 has recesses 6 at specific locations, in order that the underlying insulating circuit board substrate 1 is exposed. In accordance with FIG. 6, a circuit board surface is thereby created that is separated at the periphery from the remaining conductors 5, and on which the LED chip will later be installed.

In order to establish contact with said LED chip 8, an additional conductor surface is created as a bonding surface 9 directly adjacent to said conductor surface, which through its exposure in the upper conductor layer 5 is isolated from the surrounding conductors. This bonding surface 9 is electroconductively connected to a conductor 5, which is electrically insulated from the remaining conductor layer 5.

The conductor layer 5 is not yet coated with a solder mask. In the subsequent processing step according to FIGS. 7 and 8, a solder mask 7 is laminated onto the upper conductor layer 5 in the typical manner and according to the invention a reflecting reflective coating 3 made of a liquid and hardening ink is printed onto said solder mask 7, which coats the upper conductor layer 5 in an electrically insulating manner, using an inkjet printing process.

For this purpose, the inkjet print head 10 is guided over the solder mask 7 in the direction of the arrow 12 and sprays precisely the inkjet 11 into the border region around the later installation surface for the LED chip 8 and around the bonding surface 9.

It is important for this that the inkjet print head 10 be guided longitudinally and with its digitally controlled pressure in such a precise manner that the possibly electrically conductive ink 11 is prevented from entering the region of the insulating recesses 6 that surround the two surfaces 8 and 9.

In this manner, in accordance with FIG. 8, the reflective coating 3 ends up only in the surrounding region surrounding the surfaces 8 and 9, without, however, connecting to the electrically insulating recesses 6 which extend around the periphery of the surfaces 8 and 9.

The FIGS. 9 and 10 show a modified embodiment whereby it is not necessary to print on the solder mask 7. Instead, an insulating layer 13 can first be applied by means of an inkjet process.

Alternatively, the insulating layer 13 can also be applied using another coating process. Here as well, the same explanations apply that were given for the FIGS. 7 and 8.

It is likewise possible to dispose the solder mask 7 beneath the insulation layer 13, which preferably consists of an insulating and dielectric ink.

The bar shaped inkjet print head 10 runs in any case from left to right in the direction of the arrow 12 over the entire configuration and coats precisely the surrounding region of the recesses 6, leaving accordingly the surfaces 8 and 9 free of ink. FIG. 11 shows processing step following that in FIGS. 9 and 10, wherein it can be seen that on the upper reflective coating 3, applied by means of the inkjet printing process, an additional protective coating 4 is applied, which can also be printed numerous times.

In this manner, the upper, potentially conductive reflective coating 3 is protected and shielded from the environment. If, in particular, the reflective coating 3 consists of a silver ink that can be hardened, the coating protective coating 14 serves as an electrical insulation for the reflective coating 3. It is normally transparent.

Instead of a transparent design, this protective coating 14 may also be translucent or designed as a different color to give the light reflected from the reflective coating 3 a color component.

This protective coating 14 is also preferably applied by means of an inkjet printing process.

FIGS. 11 and 13 show that the protective coating 14 preferably coats the entire circumference of the reflective coating 3 and thereby forms the edges 15 in order to obtain an airtight, protective connection to the upper surface of the circuit board.

FIG. 15 shows, as an alternative to the embodiment of FIG. 13, that first an initial layer of an insulating layer 13 is printed onto the upper surface of the circuit board with bordering walls at a right angle to the recess.

The subsequently printed reflective coating 3 forms however, walls that are inclined to the recess 6, and the subsequently applied layers of the insulation layer 3 in turn form a wall leaning towards the recess 6, such that on the whole they form slanted walls 16 of a reflector. In this manner, by means of the slanted walls, a focusing effect is created, when the LED is installed in the region of the recess 6. FIGS. 17 and 18 show that the reflective coating 3, according to the invention, is printed onto the inclined walls of the layers 5, 13, whereby the quickly hardening ink 11 runs in the region of the walls 16, thereby forming inclined reflector surfaces, which provide a focusing effect for an LED installed in the region of the recess 6.

FIGS. 19 and 20 show the completed reflector configuration produced in this manner, having a mirror reflector with walls 16 extending from the light emitting surface 8 outwards and in a conical fashion.

FIGS. 21 and 22 show that in the region of the recess 6 an LED chip is now installed, which establishes a lead with its bond wire 17 to the bonding surface 9, establishing electrical contact there.

FIG. 21 shows accordingly a circuit board fully equipped with a single LED and a light focusing reflective coating 3, which shall be explained in greater detail based on the FIGS. 23 and 24.

There it is can be seen that the light emitting LED 8 first emits light directly upwards in the direction indicated by the arrow 18 and a portion of the light arrives from the side at the inclined slanted walls 16 and is reflected from there in the direction of the arrow 19. This requires that the light emitting LED be located below the inclined slanted walls 16 of the mirror reflector, in order to make it possible for the light from the side to meet the inclined slanted wall 16 and be deflected upwards as reflected light.

FIG. 25 shows an alternative embodiment to that in FIGS. 23 and 24. In this case it can be seen that a base layer 13 as an insulation layer is printed numerous times, whereby the printing processes always run such that first an initial insulation layer 13 is printed that hardens quickly, and then another layer is printed on the hardened layer in order to obtain the structure in FIG. 25. The reflective coating 3 is printed onto the inclined walls 16 produced in this manner using the inkjet printing process described above.

It is important here that the reflective coating 3 encompasses the entire region 8, 9 in accordance with FIG. 26 in order to obtain the largest possible mirror surface.

FIGS. 27 and 28 show further processing steps subsequent to the processing step 25, wherein an LED chip 8 is installed in the region of the recess 6, which is connected in an electroconductive manner with its bond wire 17 to the neighboring bonding surface 9.

With this embodiment as well, direct light in the arrow direction 18 is emitted directly upwards, in accordance with FIGS. 29 and 30, and likewise light reflected against the inclined slanted walls 16 is emitted upwards in the arrow direction 19. The walls 16 do not necessarily need to be inclined in a linear fashion. It is also possible to shape the walls 16 in a parabolic manner, in order to thereby obtain a parabolic reflector.

Thanks to the inkjet printing process according to the invention and the layered structure of the layers disposed below the reflective coating 3, it is possible to obtain a mirrored wall on any arbitrary shape.

This is also shown in FIG. 31, wherein it is visible, in comparison to FIG. 29, that the right hand reflector surface is formed as a planar reflector surface, while the left hand reflector surface exhibits the previously described inclined walls 16.

With the configuration in FIG. 31 an asymmetrical light distribution is obtained, while in FIG. 29 a symmetrical light distribution is obtained.

Aside from a planar reflection surface 20, it is also possible thereby to obtain a sloped reflection surface 21. FIGS. 33 and 34 show, in a deviating from the aforementioned embodiments, that it is not necessary to print the insulation layer 13 using an inkjet printing process.

In this embodiment, a base layer 22 is applied to the surface of the cover layer 4 of the circuit board using an immersion process. In this case, it makes use of a synthetic that can be hardened, which coats the entire circuit board and forms the base layer 22 for the later reflector structure.

In accordance with FIGS. 35 and 36, a photosensitive film 23 is applied to said base layer 22, which is attached in a precise fit as a mask, such that surfaces 8, 9 required later for the equipping process are left exposed.

According to FIGS. 37 and 38, the photosensitive film 23 is irradiated with a UV exposure 24, and chemically developed in accordance with the FIGS. 39 and 40. In this manner a photo-substrate 25 is formed which fits precisely on the surfaces 8, 9 in the region of the recess.

According to FIGS. 41 and 42, this photo-substrate 25 is then printed with the reflective coating 3 in a silkscreen printing process.

For this the screen 26 is coated with a corresponding screen mask which allows for the screen to be sealed in the surrounding region of the recesses 6 and the surrounding region of the surfaces 8, 9, while it remains open in the remaining edge region, and for the application, a reflector color 28 is provided that is forced through the open regions of the screen 26 with a spreading knife 27 in the spreading direction 29. In this manner, only the surrounding region of the recess 6 and the surfaces 8, 9 are coated with the reflective coating 3 using the silkscreen printing process.

FIGS. 43 and 44 show that now the installation of the LED 8 takes place and the bond wire 17 is connected in an electroconductive manner to the bonding surface 9.

FIGS. 45 and 46 show, in an embodiment developed further in comparison to FIGS. 43 and 44, that it is also possible to coat the entire configuration of FIGS. 43 and 44 with a color conversion layer 30.

In this case, this is a transparent synthetic that can harden, which contains color pigments, thus converting the light emitted form the LED into another color.

For this it is preferred that the color conversion layer be disposed in an hemisphere over the structure of the LED, and also partially cover the reflecting reflective coating 3.

In this manner it is ensured that both direct light from the LED as well as the light reflected by the reflective coating passes through the color conversion layer 30, thus contributing to a highly effective change of the light color value therein.

A light path of this type is illustrated I FIGS. 47 and 48, where it can be seen that the light emitted from the LED 8 passes through the color conversion layer 30 as direct light as well as being first reflected in the form of reflected light 19 against the inner surface of the color conversion layer 30, and then meeting the reflective coating 3 anew, and then passing through the color conversion layer in the direction of the arrow 19 as indirect light.

In this manner, deflected light arrives, through scattering in the color conversion layer 30 as well, at the planar reflection surfaces 20 of the reflective coating 3.

FIGS. 49 and 50 show that aside from the previously illustrated rectangular or quadratic mirror surfaces, it is possible to change the shape of the mirror surface to any other shape. For this purpose, FIG. 50 shows that a mirror surface of this type (planar reflection surface 20) may also be elliptical in shape.

This configuration can also be coated with a color conversion layer 30. FIGS. 51 and 52 pertain to all of the aforementioned embodiments and show, in addition to all aforementioned embodiments, that as an additional possibility, numerous LEDs can be installed in a recess of this type or, if applicable, in numerous recesses on a completed circuit board. Accordingly, the type and configuration of the reflective coating 3 is modified in order for each LED surface 8 to be able to be assigned to a bonding surface 9.

This is illustrated in FIGS. 53 and 54. There are a total of two LEDs disposed, which separately establish contact with their respective bond wires 17 to a neighboring bonding surface 9. Aside from the mirror surface shown here as a planar reflection surface 20, all aforementioned embodiments of reflection surfaces can also be used.

In a similar manner, the embodiment shows, according to FIGS. 55 and 56 that numerous LEDs can each be covered with a separate color conversion layer 30.

In this manner, numerous LEDs with, if applicable, different light colors, can be disposed on the reflection surface 20, which furthermore are each disposed under a common or under a separate color conversion layer 30. In this manner it is possible to have different colored LEDs with additional color conversion layers with this configuration that result in a color setting from a broad range of desired light colors.

FIG. 57 shows a schematic representation of the process flow according to the method of the invention.

It is illustrated in the process steps 31-33 that in producing the circuit board, said is first cleaned in process step 32, after the last production process in process step 31, and then the reflector is applied in a printing process in process step 33.

This prepared circuit board is now, accordingly . . . .

The circuit board now completed to this point, already equipped with the completed reflector, is sent to the customer and cleaned there in process step 34.

The equipping with LEDs, soldering of components, and bonding takes place in the process steps 35-37.

If applicable, process step 38, with the application of the color conversion layer 30, can follow process step 37. The process steps 39, and 40 are for the further treatment of the circuit board by the customer.

Instead of an LED chip, a photodiode for capturing light may be used. In this application, the bowed mirror may be used for focusing the light arriving at the photodiode.

In summary, it has been determined that a highly effective mirror is applied directly to the surface of a conventional circuit board. Depending on the structure of the base layer, therefore, either a planar mirror, or a bowed mirror, for light deflection or focusing, may be created. As a result of the implementation of a protective cover layer 4, environmental effects, or the danger of blistering or corrosion of the reflective coating 3, can be prevented.

The field of application for the invention concerns, therefore, standard circuit boards and circuit boards wherein a sensor, e.g. a photodiode, is installed. Likewise, a laser diode may be used to direct or focus the emitted beam in a specific direction.

In summary, the characteristics of the circuit board according to the invention are presented:

All (at least 3) layers 2, 3, 4 must be solder resistant.

The base layer 2 or the multiple base layers 2a-2c for forming a three-dimensional reflector may also be an epoxy resin.

The later mirror layer 3 may be primed (palladium, etc.) and then coated with a mirror plating either electrochemically, or through electroplating. In this case, a cover layer 4 is absolutely necessary.

This cover layer 4 must remain highly transparent, despite the soldering bath—this can, of course, be a transparent solder mask lacquer, e.g. probimer.

For a parabolic reflector, the LED emitter is to be positioned nearly exactly in the focal point.

Furthermore, a reflector material of the reflective coating 3 may also cause a color conversion or color modification, as reflectors generally have a wavelength specific reflection.

The advantage of the present invention is that the reflectivity of a circuit board to the LED range is fundamentally improved. While with conventional white solder masks only a degree of reflection of 20-60% can be obtained, through the technical teachings of the invention it is possible to obtain a degree of reflection of 90-95%.

The degree of reflection also depends on the wavelength of the light emitted by the LED.

By means of the technical teachings of the invention, the light yield and the light density of conventional LEDs installed on circuit boards is significantly increased.

| List of Reference Symbols | |
|---|---|
| 1 | Circuit board substrate |
| 2 | Base layer, 2a, 2b, 2c |
| 3 | Reflective coating |
| 4 | Cover layer |
| 5 | Conductors |
| 6 | Recess |
| 7 | Solder mask |
| 8 | LED chip |
| 9 | Bonding surface |
| 10 | Printer head |
| 11 | Ink |
| 12 | Printing direction |
| 13 | Insulation layer |
| 14 | Protective coating |

-continued

| List of Reference Symbols | |
|---|---|
| 15 | Edge |
| 16 | Wall (slanted) |
| 17 | Bond wire |
| 18 | Arrow direction (direct) |
| 19 | Arrow direction (indirect) |
| 20 | Planar reflection surface |
| 21 | Slanted reflection surface |
| 22 | Base layer (immersion process) |
| 23 | Photosensitive film |
| 24 | UV exposure |
| 25 | Photo substrate |
| 26 | Screen |
| 27 | Spreading knife |
| 28 | Reflector color |
| 29 | Spreading direction |
| 30 | Color conversion layer |
| 31 | Process step |
| 32 | Process step |
| 33 | Process step |
| 34 | Process step |
| 35 | Process step |
| 36 | Process step |
| 37 | Process step |
| 38 | Process step |
| 39 | Process step |
| 40 | Process step |

The invention claimed is:

1. A method for the production of a circuit board having a reflective coating and at least one electroconductively contacted LED, whereby the reflective coating is printed onto a surface of the circuit board and a protective coating comprising one of a partially transparent and a transparent cover layer is printed onto the reflective coating by means of inkjet printing, wherein on the surface of the circuit board, first a base layer is applied with inkjet printing before the reflective coating is applied, whereby the reflective coating comprises an oxide layer with a noble metal, the method comprising:
   a) exposing an uppermost conductor layer to form a recess for the purpose of exposing the underlying circuit board substrate and creating an installation surface for the LED;
   b) disposing an electroconductive bonding surface in the neighborhood of the installation surface for the LED;
   c) applying a solder mask onto the uppermost conductor layer;
   d) printing of the base layer;
   e) printing the reflective coating in a surrounding region of the installation surface for the LED and the bonding surface by means of inkjet printing; and
   f) printing the cover layer at least partially covering the reflective coating.

2. The method according to claim 1, wherein the base layer is three-dimensional in shape.

3. The method according to claim 2, further comprising the step of forming, during a lamination process of the circuit board, a plurality of one of three-dimensional rises and depressions in the conductor layer at the location of the reflective coating to be applied later.

4. The method according to claim 2, wherein the step of printing the reflective coating comprises the steps of: priming a silver layer and subsequently applying an electroplating with copper.

5. The method according to claim 2, further comprising the step of smoothing out the reflective coating after application the step of electropolishing.

6. The method according to claim 2, wherein the reflective coating is bowed in one of a convex and a concave shape.

7. The method according to claim 2, further comprising the step of three-dimensionally shaping, the circuit board at least at the location of the reflective coating.

8. The method according to claim 1, further comprising the step of forming, during a lamination process of the circuit board, a plurality of one of three-dimensional rises and depressions in the conductor layer at the location of the reflective coating to be applied later.

9. The method according to claim 1, wherein the step of printing the reflective coating comprises the steps of: priming a silver layer and subsequently applying an electroplating with copper.

10. The method according to claim 1, wherein the step of printing the reflective coating comprises the step of creating the reflective coating by means of a structured photo exposure.

11. The method according to claim 1, further comprising the step of smoothing out the reflective coating after application the step of electropolishing.

12. The method according to claim 1, wherein the reflective coating is bowed in one of a convex and a concave shape.

13. The method according to claim 1, further comprising the step of three-dimensionally shaping, the circuit board at least at the location of the reflective coating.

14. The method according to claim 13, wherein the step of shaping the circuit board comprises shaping a curvature of the circuit board at a location of the reflective coating.

15. The method according to claim 13, wherein the step of shaping the circuit board comprises application processing in the form of ink jet printing a curvature of the circuit board at a location of the reflective coating.

16. The method according to claim 1, wherein the printed reflective coating has a plurality of inclined slanted walls and the method further comprises the step of printing thereon an insulation layer likewise slanted towards the recess to form a plurality of inclined walls such that it forms, as a whole, inclined walls of a mirror.

17. The method according to claim 1, wherein the step of printing the reflective coating comprises printing with a quickly hardening ink that runs during the step of printing with a quickly hardening ink in the region of a plurality of inclined walls, thereby forming inclined reflective surfaces, having a focusing effect on the LED, and wherein the step of installing the LED on the circuit board comprises the step of installing the LED in a region of the recess.

18. The method according claim 1, wherein the method further comprises the step of covering the LED by a color conversion layer.

19. The method according to claim 1, wherein the step of installing the LED on the circuit board comprises installing a plurality of LEDs on the circuit board and wherein the method further comprises the step of covering the plurality of LEDs each with a separate color conversion.

20. A circuit board, comprising:
a reflective coating and at least one electroconductively contacted LED, whereby the reflective coating is printed onto a surface of the circuit board and a protective coating comprising one of a partially transparent and a transparent cover layer is printed onto the reflective coating by means of inkjet printing, wherein on the surface of the circuit board, first a base layer is applied with inkjet printing before the reflective coating is applied, whereby the reflective coating comprises an oxide layer with a noble metal, and further comprising:
an uppermost conductor layer forming a recess for the purpose of exposing the underlying circuit board substrate and creating an installation surface for installing the LED on the circuit board;
an electroconductive bonding surface in the neighborhood of the installation surface for the LED;
a solder mask applied onto the uppermost conductor layer;
the reflective coating is printed on a surrounding region of the installation surface for the LED and the bonding surface; and
the cover layer is at least partially covering the reflective coating.

21. A circuit board according to claim 20, wherein the reflective coating comprises a quick drying ink composition comprising an ink having non-metallic pigments.

* * * * *